(12) United States Patent
Kikkawa et al.

(10) Patent No.: US 12,509,632 B2
(45) Date of Patent: *Dec. 30, 2025

(54) TREATMENT LIQUID FOR SEMICONDUCTORS AND METHOD FOR PRODUCING SAME

(71) Applicant: TOKUYAMA CORPORATION, Yamaguchi (JP)

(72) Inventors: Yuki Kikkawa, Yamaguchi (JP); Tomoaki Sato, Yamaguchi (JP); Takafumi Shimoda, Yamaguchi (JP); Takayuki Negishi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 356 days.

This patent is subject to a terminal disclaimer.

(21) Appl. No.: 17/915,697

(22) PCT Filed: Mar. 31, 2021

(86) PCT No.: PCT/JP2021/013822
§ 371 (c)(1),
(2) Date: Sep. 29, 2022

(87) PCT Pub. No.: WO2021/201094
PCT Pub. Date: Oct. 7, 2021

(65) Prior Publication Data
US 2023/0126771 A1    Apr. 27, 2023

(30) Foreign Application Priority Data
Mar. 31, 2020    (JP) ................................ 2020-064912

(51) Int. Cl.
C09K 13/00    (2006.01)
H01L 21/3213    (2006.01)

(52) U.S. Cl.
CPC ........ *C09K 13/00* (2013.01); *H01L 21/32134* (2013.01)

(58) Field of Classification Search
None
See application file for complete search history.

(56) References Cited

U.S. PATENT DOCUMENTS

| | | |
|---|---|---|
| 2005/0156140 A1 | 7/2005 | Shimizu et al. |
| 2005/0176603 A1 | 8/2005 | Hsu |
| 2009/0175962 A1* | 7/2009 | Fishler .................... C02F 1/766 424/723 |
| 2012/0256122 A1* | 10/2012 | Sato ................. H01L 21/32134 252/79.1 |
| 2013/0302938 A1 | 11/2013 | Sato et al. |
| 2013/0303420 A1 | 11/2013 | Cooper et al. |
| 2015/0048053 A1 | 2/2015 | Cordonier et al. |
| 2021/0062115 A1 | 3/2021 | Shimoda et al. |
| 2021/0180192 A1 | 6/2021 | Sugimura et al. |
| 2021/0340095 A1* | 11/2021 | Sato ...................... H01L 23/532 |
| 2021/0388508 A1* | 12/2021 | Sato ................... H01L 21/30604 |
| 2022/0328320 A1* | 10/2022 | Kikkawa ................... C23F 1/46 |
| 2022/0411937 A1* | 12/2022 | Sato .................. H01L 21/32134 |
| 2023/0207329 A1* | 6/2023 | Sato ........................... C23F 1/40 438/745 |
| 2023/0257887 A1* | 8/2023 | Sato ........................... C23F 1/40 216/75 |
| 2024/0014045 A1* | 1/2024 | Shimoda ............. H01L 21/3213 |
| 2024/0182404 A1* | 6/2024 | Sato .................... H01L 21/3205 |

FOREIGN PATENT DOCUMENTS

| | | |
|---|---|---|
| JP | 11-293478 | 10/1999 |
| JP | 2003-193272 | 7/2003 |
| JP | 2004-031791 | 1/2004 |
| JP | 2005-166924 | 6/2005 |
| JP | 2008-124494 | 5/2008 |
| JP | 2011-151287 | 8/2011 |
| JP | 2013-254946 | 12/2013 |
| WO | 2013/136555 | 9/2013 |
| WO | 2016/003729 | 1/2016 |
| WO | 2019/142788 | 7/2019 |
| WO | 2020/054296 | 3/2020 |

OTHER PUBLICATIONS

International Search Report issued Jun. 29, 2021 in International (PCT) Application No. PCT/JP2021/013822.

* cited by examiner

Primary Examiner — Allan W. Olsen
(74) Attorney, Agent, or Firm — Wenderoth, Lind & Ponack, L.L.P.

(57) ABSTRACT

A treatment liquid for a semiconductor containing a group 6 metal, the treatment liquid containing hypobromite ions. Also provided is a treatment liquid for a semiconductor containing a group 6 metal, the treatment liquid characterized by being formed by adding and mixing at least a bromine-containing compound, an oxidizing agent, a base compound, and water, wherein relative to a total mass, an added amount of the bromine-containing compound is 0.008 mass % or more and less than 10 mass % as an amount of bromine element, and an added amount of the oxidizing agent is 0.1 mass ppm or more and 20 mass % or less; and pH at 25° C. is 8 or higher and 14 or lower. Further provided is a method for producing the treatment liquid for a semiconductor.

17 Claims, No Drawings

TREATMENT LIQUID FOR SEMICONDUCTORS AND METHOD FOR PRODUCING SAME

TECHNICAL FIELD

The present invention relates to a novel treatment liquid to etch a group 6 metal. The novel treatment liquid is to be brought into contact with a semiconductor wafer containing a group 6 metal and to etch the group 6 metal in a manufacturing process for semiconductor elements.

BACKGROUND ART

Group 6 metals are widely used in electronic devices, such as semiconductor elements; they are used, for example, in contact materials connecting the electrode of a transistor and a metal wiring, and in gate materials for 3D-NANDs.

When a group 6 metal is selected as a wiring material in a wiring formation process of a semiconductor element, the wiring is formed by dry or wet etching and by CMP polishing as in the case of wiring materials in the related art. The time required for these processes directly affects semiconductor manufacturing costs, and there is a demand for a technique that can reduce treatment time.

In addition, a group 6 metal deposited on a semiconductor substrate at a portion where the deposition is not necessary needs to be etched away. In particular, a group 6 metal deposited on an end surface or a back surface of the substrate may cause contamination and process instability in a later process. Thus, this leads to a desire for complete removal of the group 6 metal deposited on a portion where the deposition is not necessary.

When a group 6 metal is wet-etched, the dissolution rate of the metal per unit time, that is, the etching rate is important. With a high etching rate, the metal can be dissolved in a short time, and thus this can increase the number of wafers treated per unit time.

As a treatment liquid for use in etching tungsten from such a wafer for a semiconductor, Patent Document 1 proposes the treatment liquid for a wafer having tungsten, the treatment liquid containing hypochlorite ions and a solvent, and having a pH higher than 7 and lower than 12.0 at 25° C. Patent Document 1 indicates that the treatment liquid contains hypochlorite ions and is capable of removing ruthenium and tungsten deposited on an end surface or a back surface of the semiconductor wafer.

Patent Document 2 proposes an etching liquid for tungsten, the etching liquid containing nitric acid, fluoride, an iron salt, and water. Patent Document 2 indicates that the etching liquid is capable of etching tungsten at a high rate, the tungsten used in production of semiconductor integrated circuits or flat panel displays.

Patent Document 3 proposes an etching liquid for tungsten and a tungsten alloy, the etching liquid having a pH of 7 or lower and containing hydrogen peroxide and an alkaline component. Patent Document 3 indicated that the etching liquid is capable of stable etching of an electrode and wiring of thin film transistors of semiconductor devices or liquid crystal display devices as well as tungsten used as the wiring or barrier metal of these electrodes.

Patent Document 4 proposes a tungsten metal removing solution containing orthoperiodic acid and water. Patent Document 4 indicates that the removing solution is capable of stable removal of unnecessary tungsten metal that is formed as a film or deposited on a semiconductor substrate.

Patent Document 5 discloses a method for processing copper and molybdenum with a chemical solution containing an oxidizing agent and an acid to form wiring. The oxidizing agent is exemplified by hydrogen peroxide, persulfuric acid, nitric acid, hypochlorous acid, permanganic acid, and dichromic acid. In addition, Patent Document 5 indicates an example in which a molybdenum film was etched using, as the chemical solution, an aqueous solution containing hydrogen peroxide and a carboxylic acid.

CITATION LIST

Patent Documents

Patent Document 1: WO 2019/142788
Patent Document 2: JP 2011-151287 A
Patent Document 3: JP 2004-031791 A
Patent Document 4: JP 2005-166924 A
Patent Document 5: JP 2013-254946 A

SUMMARY OF INVENTION

Technical Problem

To etch the metal from a semiconductor wafer having a group 6 metal, the etching rate of the metal is important. However, a study by the present inventor revealed that the treatment liquids in the art described in the above patent documents have room for improvement in terms of the following.

For example, Patent Document 1 describes a treatment liquid for a wafer having tungsten, the treatment liquid with a pH higher than 7 and lower than 12.0, but the etching rate of tungsten cannot be said to be sufficient with the treatment liquid described in Patent Document 1.

The etching liquid described in Patent Document 2 etches a silicon substrate and an oxide film to no small extent and thus is not practical.

The etching liquid described in Patent Document 3 contains hydrogen peroxide as a main component and has a problem of an unstable etching rate and a short life of the etching liquid due to self-decomposition reaction of hydrogen peroxide. In addition, the etching rate cannot be said to be sufficient.

For the removing solution described in Patent Document 4, the etching rate of the removing solution including orthoperiodic acid and water cannot be said to be sufficient. In addition, the document also discloses an example in which the etching rate is improved by further adding hydrofluoric acid to orthoperiodic acid and water, but hydrofluoric acid damages a silicon substrate as described above and thus is not preferred.

The chemical solution described in Patent Document 5 contains an oxidizing agent and an acid. The oxidizing agent disclosed in Examples of Patent Document 5 is only hydrogen peroxide, and hydrogen peroxide has a problem of an unstable etching rate and a short life of the solution due to the self-decomposition reaction of hydrogen peroxide as described above. In addition, the etching rate cannot be said to be sufficient.

Thus, the present invention has been made in view of the background arts described above, and an object of the present invention is to provide a treatment liquid that is capable of etching a group 6 metal at a high rate stably for a long period of time even at ordinary temperature without damaging a silicon-based material contained in a substrate.

Solution to Problem

The present inventors have conducted diligent research to solve the above problems. The present inventors have then found that, by treating a group 6 metal with a treatment liquid containing a hypobromite ion, the metal can be etched at a high rate even at ordinary temperature without damaging a silicon-based material. Furthermore, the present inventors have found that a bromine-containing compound added to an alkaline treatment liquid is oxidized and turned into bromine oxide by an oxidizing agent in the treatment liquid, and a group 6 metal can be etched stably. Moreover, the present inventors have found that both a sufficient etching rate and stability can be achieved with an appropriate pH range, bromine-containing compound concentration range, and oxidizing agent concentration range, and completed the present invention.

That is, the present invention is configured as follows.

Aspect 1. A treatment liquid for a semiconductor of a group 6 metal, the treatment liquid containing hypobromite ions.

Aspect 2. The treatment liquid for a semiconductor according to aspect 1, wherein the group 6 metal is at least one type of metal selected from the group consisting of tungsten, molybdenum, and chromium.

Aspect 3. The treatment liquid for a semiconductor according to aspect 1 or 2, wherein the hypobromite ions are 0.001 mol/L or more and 1.2 mol/L or less.

Aspect 4. The treatment liquid for a semiconductor according to any one of aspects 1 to 3, wherein pH of the treatment liquid for a semiconductor is 8 or higher and 14 or lower at 25° C.

Aspect 5. The treatment liquid for a semiconductor according to any one of aspects 1 to 4, further containing a tetraalkylammonium ion.

Aspect 6. The treatment liquid for a semiconductor according to any one of aspects 1 to 5, wherein the treatment liquid for a semiconductor further contains an oxidizing agent, and an oxidation-reduction potential of the oxidizing agent exceeds an oxidation-reduction potential of a hypobromite ion/Br⁻ system.

Aspect 7. The treatment liquid for a semiconductor according to aspect 6, wherein the oxidizing agent contained in the treatment liquid for a semiconductor is hypochlorite ions, periodic acid, or ozone.

Aspect 8. The treatment liquid for a semiconductor according to any one of aspects 1 to 7, wherein the treatment liquid for a semiconductor further contains chloride ions, and a ratio of the hypobromite ions to the chloride ions is 0.001 or more and 10 or less.

Aspect 9. The treatment liquid for a semiconductor according to any one of aspects 1 to 8, wherein the treatment liquid for a semiconductor further contains chloride ions, and a ratio of the hypobromite ions to the chloride ions is 0.05 or more and 10 or less.

Aspect 10. A method for producing the treatment liquid for a semiconductor described in any one of aspects 1 to 9, the method comprising mixing a solution containing a base compound with hypobromous acid, a hypobromite salt, bromine water, or bromine gas.

Aspect 11. A method for producing the treatment liquid for a semiconductor described in any one of aspects 1 to 9, the method comprising mixing a solution containing a hypochlorous acid compound and a base compound with a bromine-containing compound.

Aspect 12. A treatment liquid for a semiconductor containing a group 6 metal, the treatment liquid containing at least a bromine-containing compound, an oxidizing agent, a base compound, and water, wherein, relative to a total mass, an added amount of the bromine-containing compound is 0.008 mass % or more and less than 10 mass % in terms of bromine element, and an added amount of the oxidizing agent is 0.1 mass ppm or more and 20 mass % or less; and pH at 25° C. is 8 or higher and 14 or lower.

Aspect 13. The treatment liquid for a semiconductor according to aspect 12, wherein the treatment liquid for a semiconductor further contains chloride ions, and a ratio of hypobromite ions to the chloride ions is 0.001 or more and 10 or less.

Aspect 14. The treatment liquid for a semiconductor according to aspect 12 or 13, wherein the oxidizing agent is a hypochlorous acid compound or ozone.

Aspect 15. The treatment liquid for a semiconductor according to any one of aspects 12 to 14, wherein the bromine-containing compound is a bromine salt or hydrogen bromide.

Aspect 16. The treatment liquid for a semiconductor according to aspect 15, wherein the bromine salt is a tetraalkylammonium bromide.

Aspect 17. The treatment liquid for a semiconductor according to any one of aspects 12 to 16, wherein the base compound is tetramethylammonium hydroxide.

Aspect 18. The treatment liquid for a semiconductor according to any one of aspects 12 to 17, wherein pH of the treatment liquid at 25° C. is 8 or higher and 13 or lower.

Aspect 19. A method for producing the treatment liquid for a semiconductor described in any one of aspects 12 to 18, the method comprising mixing a solution containing the oxidizing agent and the base compound with the bromine-containing compound.

Aspect 20. A method for treating a substrate, the method comprising: preparing a treatment liquid for a semiconductor by the production method described in aspect 19, and then etching a film containing a group 6 metal deposited on a substrate by the treatment liquid for a semiconductor.

Aspect 21. Use of the treatment liquid for a semiconductor described in any one of aspects 12 to 18 in treatment of a substrate comprising a film containing a group 6 metal.

Advantageous Effects of Invention

According to an embodiment of the present invention, in a semiconductor formation process, a group 6 metal can be stably etched at a sufficiently high rate without a damage to a silicon-based material contained in a substrate. Furthermore, according to an embodiment of the present invention, roughness of a transition metal surface after etching can be reduced and smoothness can be maintained. This improves the processing accuracy of a transition metal contained in a semiconductor wafer and improves the yield as well as wafer treatment efficiency per unit time.

DESCRIPTION OF EMBODIMENTS

Treatment Liquid for Semiconductor

A treatment liquid according to an embodiment of the present invention is a treatment liquid (composition) characterized by containing hypobromite ions (BrO⁻). The hypobromite ion is an oxidizing agent with strong oxidation properties, and the treatment liquid according to an embodiment of the present invention containing hypobromite ions can etch a group 6 metal at a high rate. Furthermore, another aspect of the treatment liquid of the present invention is a treatment liquid characterized by containing a composition containing at least a bromine-containing compound, an oxidizing agent, a base compound, and water, the treatment liquid being capable of etching a group 6 metal at a high rate. Thus, the treatment liquid according to an embodiment of the present invention can be suitably used in a process, such as etching, residue removal, washing, and CMP, in a semiconductor manufacturing process. In the following description, tungsten, molybdenum, and chromium may be collectively referred to as the group 6 metal (metal of group 6 elements). In addition, a "semiconductor of the group 6 metal" means a semiconductor element containing the group 6 metal and a semiconductor wafer having the group 6 metal on its surface or inside.

The treatment liquid according to an embodiment of the present invention can be used in a process in which etching the group 6 metal is necessary in a semiconductor manufacturing process. In addition, the treatment liquid can remove the group 6 metal deposited on an end surface or a back surface of a semiconductor wafer at a sufficient etching rate. The sufficient etching rate in an embodiment of the present invention refers to an etching rate of 50 nm/min or more when the group 6 metal is tungsten, an etching rate of 50 nm/min or more when the group 6 metal is molybdenum, and an etching rate of 50 nm/min or more when the group 6 metal is chromium.

The treatment liquid in an embodiment of the present invention etches the group 6 metal but does not etch a metal, such as silicon, silicon oxide, copper, cobalt, titanium, platinum, titanium nitride, and tantalum nitride, or the etching rate for a metal of these is extremely low compared with that for the group 6 metal. Thus, the treatment liquid does not damage a substrate material containing a metal of these and can selectively etch the group 6 metal in a process, such as a semiconductor manufacturing process.

Hypobromite ions contained in the treatment liquid according to an embodiment of the present invention can be generated in the treatment liquid or can be added as a hypobromite salt to the treatment liquid. The hypobromite salt referred to here is a salt containing the hypobromite ion or a solution containing the salt. To generate hypobromite ions in the treatment liquid, for example, bromine gas is blown into the treatment liquid. In this case, from the viewpoint of efficiently generating hypobromite ions, the treatment liquid is preferably at 50° C. or lower. When the treatment liquid is at 50° C. or lower, not only hypobromite ions can be generated efficiently but also the generated hypobromite ions can be stably used for etching the group 6 metal. Furthermore, to dissolve more bromine in the treatment liquid, the temperature of the treatment liquid is more preferably 30° C. or lower and most preferably 25° C. or lower. The lower limit of the temperature of the treatment liquid is not particularly limited, but the treatment liquid preferably does not freeze. Thus, the treatment liquid is preferably at −35° C. or higher, more preferably at −15° C. or higher, and most preferably at 0° C. or higher.

Furthermore, when hypobromite ions are generated by blowing bromine gas into the treatment liquid, the treatment liquid when containing bromide ions ($Br^-$) improves the solubility of bromine gas ($Br_2$). This is because $Br_2$ dissolved in the treatment liquid reacts with $Br^-$ and $Br_3^-$ and forms a complex ion, such as $Br_3^-$ or $Br_5^-$, which is stabilized in the treatment liquid. The treatment liquid containing a large amount of $Br_2$, $Br^-$, $Br_3^-$, or $Br_5^-$ can form more hypobromite ions and thus can be suitably used as the treatment liquid according to an embodiment of the present invention.

To add hypobromite ions as a compound to the treatment liquid, hypobromous acid, bromine water, and/or a hypobromite salt may be added. The hypobromite salt is suitably sodium hypobromite, potassium hypobromite, or a tetraalkylammonium hypobromite. From the viewpoint of absence of a metal ion, which is otherwise problematic in semiconductor manufacturing, hypobromous acid or a tetraalkylammonium hypobromite is more suitable.

The tetraalkylammonium hypobromite is easily formed by passing bromine gas through a tetraalkylammonium hydroxide solution. In addition, the tetraalkylammonium hypobromite is also formed by mixing hypobromous acid and a tetraalkylammonium hydroxide solution. Furthermore, the tetraalkylammonium hypobromite can also be formed by replacing a cation contained in a hypobromite salt, such as sodium hypobromite, with a tetraalkylammonium ion using an ion exchange resin.

A concentration of the hypobromite ions in the treatment liquid according to an embodiment of the present invention is not particularly limited as long as the treatment liquid does not depart from the object of the present invention, but is preferably 0.001 mol/L or more and 1.2 mol/L or less in terms of bromine element contained in the hypobromite ions. With the concentration less than 0.001 mol/L, the rate of etching the group 6 metal would be low, reducing practicality. On the other hand, with the concentration greater than 1.2 mol/L, the etching rate of the group 6 metal would be less likely to be stable. To stably etch the group 6 metal at a sufficient rate, the concentration of the hypobromite ions is preferably 0.001 mol/L or more and 1.2 mol/L or less in terms of bromine element contained in the hypobromite ions, more preferably 0.001 mol/L or more and 1 mol/L or less, particularly preferably 0.005 mol/L or more and 0.50 mol/L or less, and most preferably 0.01 mol/L or more and 0.2 mol/L or less.

The concentration of the hypobromite ions in the treatment liquid can be determined using a widely known method. For example, using ultraviolet-visible absorption spectroscopy, absorption due to hypobromite ions can be easily observed and the hypobromite ion concentration can be determined from the intensity of the absorption peak (generally at or near 330 nm although this depends on the pH of the treatment liquid and the hypobromite ion concentration). Furthermore, the hypobromite ion concentration can also be determined by iodine titration. In addition, the hypobromite ion concentration can be determined from the oxidation-reduction potential (ORP) and pH of the treatment liquid. The measurement by ultraviolet-visible absorption spectroscopy is most preferred from the viewpoint of enabling contactless and continuous measurement. In measuring the hypobromite ion concentration by ultraviolet-visible absorption spectroscopy, when absorption due to another chemical species is present, the hypobromite ion concentration can be determined with sufficient accuracy by data processing, such as spectral splitting or baseline correction, properly selecting the reference, or the like.

An acid dissociation constant ($pK_a$) of hypobromous acid (HBrO) and the hypobromite ion ($BrO^-$) is 8.6, and thus there may be a case where HBrO and $BrO^-$ coexist depending on the pH of the treatment liquid, such as at low pH. For the treatment liquid containing HBrO and $BrO^-$, a total concentration of HBrO and $BrO^-$ is used as the concentration of hypobromite ions described above.

Details of the mechanism in which hypobromite ions dissolve the group 6 metal are not necessarily clear but are speculated to be as follows. An example will be described below for a case where the group 6 metal is tungsten, but the mechanism is considered to be similar for molybdenum and chromium as well. It is speculated that, in the treatment liquid, the hypobromite ion or hypobromous acid produced from the hypobromite ion oxidizes tungsten to produce $WO_4^{2-}$ which dissolves in the treatment liquid. To dissolve tungsten as $WO_4^{2-}$, the pH of the treatment liquid is more preferably 8 or higher and 14 or lower and most preferably 8 or higher and 13 or lower. With the pH of the treatment liquid of 8 or higher and 14 or lower, tungsten dissolves as $WO_4^{2-}$ in the treatment liquid.

To adjust the pH of the treatment liquid, an acid or an alkali can be added to the treatment liquid. The acid can be either an inorganic acid or an organic acid, and an example includes hydrofluoric acid, hydrochloric acid, hydrobromic acid, nitric acid, sulfuric acid, and peroxodisulfuric acid; and a carboxylic acid, such as formic acid and acetic acid, but in addition to these, a widely known acid used in a treatment liquid for a semiconductor can be used without any limitation. For the alkali, an organic alkali is preferably used because it does not contain a metal ion, which is otherwise problematic in semiconductor manufacturing. Among organic alkalis, an onium salt containing an onium ion is preferably used. An example of the onium salt includes a tetraalkylammonium hydroxide including a tetraalkylammonium ion and a hydroxide ion. For example, the number of carbons in the alkyl of the tetraalkylammonium ion derived from the tetraalkylammonium hydroxide can be 1 or more and 20 or less, and the number is preferably 1 or more and 10 or less. Examples of the tetraalkylammonium hydroxide include tetramethylammonium hydroxide, tetraethylammonium hydroxide, tetrapropylammonium hydroxide, and tetrabutylammonium hydroxide. Among these, the organic alkali is preferably a tetraalkylammonium hydroxide and more preferably tetramethylammonium hydroxide because it provides a large number of hydroxide ions per unit weight and high-purity products are readily available.

One type of the tetraalkylammonium ions can be contained in the treatment liquid, or a plurality of types can be used in combination.

The treatment liquid according to an embodiment of the present invention preferably contains an oxidizing agent. An oxidizing agent is contained in the treatment liquid according to an embodiment of the present invention and thus serves to oxidize bromide ions ($Br^-$), which has been produced by decomposition or reduction of hypobromite ions, to hypobromite ions again.

When oxidizing the group 6 metal, hypobromite ions are reduced to $Br^-$. In addition, hypobromite ions are easily decomposed naturally in the treatment liquid, and some change to $Br^-$. Furthermore, ultraviolet light or visible light promotes decomposition of hypobromite ions and changes some to $Br^-$. Moreover, decomposition of hypobromite ions also proceeds by heating, contact with an acid, or contact with a metal, and some change to $Br^-$. As the reduction or decomposition of hypobromite ions proceeds, the etching rate of the group 6 metal decreases. An appropriate oxidizing agent is contained in the treatment liquid, and this can oxidize $Br^-$, which has been produced by reduction or decomposition, to hypobromite ions and can mitigate the decrease in the etching rate of the group 6 metal. That is, hypobromite ions and an appropriate oxidizing agent are contained in the treatment liquid, and this prolongs the time where the etching rate is stable.

For the oxidizing agent that can be contained in the treatment liquid, an oxidation-reduction potential between the oxidizing agent and chemical species produced by reduction of the oxidizing agent preferably exceeds an oxidation-reduction potential of a hypobromite ion/$Br^-$ system. Using such an oxidizing agent can oxidize $Br^-$ to hypobromite ions. The oxidation-reduction potential between the oxidizing agent that can be contained in the treatment liquid and chemical species produced by reduction of the oxidizing agent varies with the concentrations of the oxidizing agent and of the chemical species produced by reduction of the oxidizing agent, temperature and pH of the solution, and the like. Regardless of these conditions, the oxidation-reduction potential between the oxidizing agent and the chemical species produced by reduction of the oxidizing agent only needs to exceed the oxidation-reduction potential of the hypobromite ion/$Br^-$ system.

On the other hand, for the oxidizing agent that can be contained in the treatment liquid, the upper limit of the oxidation-reduction potential between the oxidizing agent and the chemical species produced by reduction of the oxidizing agent is not particularly limited as long as it does not depart from the object of the present invention.

For the oxidizing agent that can be contained in the treatment liquid according to an embodiment of the present invention, hypochlorite ions or ozone is preferably used because they do not contain a metal element, which is otherwise problematic in semiconductor manufacturing. Among these, hypochlorite ions are more suitable in that they are highly soluble in the treatment liquid and stably present in the solution, and the concentration is easily adjusted.

Hypochlorite ions and ozone have an ability to reoxidize $Br^-$ to hypobromite ions in an alkaline treatment liquid (a pH of 8 or higher and 14 or lower). This is understandable also from the following: the oxidation-reduction potential of a hypochlorite ion/$Cl^-$ system is 0.89 V, and the oxidation-reduction potential of an ozone/oxygen system is 1.24 V, whereas the oxidation-reduction potential of the hypobromite ion/$Br^-$ system is 0.76 V. The oxidation-reduction potentials above are values for a standard hydrogen electrode at pH 14 (25° C.). Thus, the treatment liquid according to an embodiment of the present invention containing hypobromite ions and hypochlorite ions or ozone oxidizes $Br^-$ to hypobromite ions and can maintain high concentration of hypobromite ions in the treatment liquid accordingly, and thus can stabilize the etching rate of the group 6 metal.

A concentration of hypochlorite ions in the treatment liquid according to an embodiment of the present invention is not particularly limited as long as it does not depart from the spirit of the present invention but is preferably 0.005 mass % or more and 20 mass % or less. With the concentration of hypochlorite ions less than 0.005 mass %, the treatment liquid can not efficiently oxidize $Br^-$, thus reducing the etching rate of the group 6 metal. On the other hand, with the added amount of hypochlorite ions more than 20 mass %, the stability of hypochlorite ions decreases, and thus this is not appropriate. From the viewpoint of the etching rate of the group 6 metal, the concentration of the oxidizing agent is more preferably 0.02 mass % or more and 10 mass % or less and most preferably 0.05 mass % or more and 5 mass % or less.

In the treatment liquid according to an embodiment of the present invention, a ratio (molar ratio) of hypobromite ions to chloride ions contained in the treatment liquid is preferably from 0.001 or more and 10 or less. The treatment liquid contains chloride ions in the range described above and thus can maintain a sufficient etching rate for the group 6 metal and prevent roughening of a surface due to etching. From the viewpoint of achieving both a sufficient etching rate and smoothness, the ratio of hypobromite ions to chloride ions is preferably 0.001 or more and 10 or less, more preferably 0.05 or more and 10 or less, even more preferably 0.1 or more and 1 or less, and most preferably 0.1 or more and 0.5 or less.

In addition to chloride ions, the treatment liquid according to an embodiment of the present invention can contain at least one anionic species selected from halate ions, halite ions, and halide ions other than chloride ions. Specifically, examples of the anionic species include halate ions, such as $ClO_3^-$, $BrO_3^-$, and $IO_3^-$; halite ions, such as $ClO_2^-$, $BrO_2^-$, and $IO_2^-$; and halide ions, such as $Br^-$ and $I^-$. One of these anionic species can be contained in the treatment liquid, or two or more anionic species can be contained. For the treatment liquid containing two or more anionic species, either of the following is possible: for example, the treatment liquid contains ions of halogen atoms with the same oxidation number, as in a case where the treatment liquid contains two types of the halate ions; or the treatment liquid contains ions of halogen atoms with different oxidation numbers, as in a case where the treatment liquid contains one type of the halite ions and one type of the halide ions.

Among these, from the viewpoint of solubility in the treatment liquid, ease of availability, cost and the like, the treatment liquid preferably contains halide ions as the anionic species, and more preferably two or more types of anions. When the treatment liquid contains two or more types of anions, from the viewpoint of effective suppression of roughening of the metal surface, the treatment liquid particularly preferably contains a halide ion and an anionic species with a different oxidation number from a halogen atom of the halide ion.

The anionic species used in an embodiment of the present invention can be generated by dissolving an acid, a salt, or the like containing the anionic species in the treatment liquid. Examples of the acid containing the anionic species include halic acids, such as chloric acid, bromic acid, and iodic acid; halous acids, such as chlorous acid, bromous acid, and iodous acid; and hydrogen halides, such as hydrogen chloride, hydrogen bromide, and hydrogen iodide. In addition, examples of the salt containing the anionic species include alkali metal salts, alkaline earth metal salts, and organic salts. Specifically, examples of the alkali metal salt include potassium chloride, sodium chlorite, potassium bromide, sodium bromite, potassium iodide, and sodium iodite; and examples of the organic salt include organic salts containing an onium ion, such as quaternary alkylammonium salts, such as tetramethylammonium chloride, tetramethylammonium bromide, and tetramethylammonium iodide. In addition, the hydrogen halide can also be generated by dissolving a halogen gas, such as chlorine gas, bromine gas, or iodine gas, in water. Among these, an acid or an organic salt containing an anionic species are preferably used because they do not contain metal, which is otherwise a main cause of decrease in yield in semiconductor manufacturing. Furthermore, in view of ease of industrial availability and ease of handling, an organic salt containing an onium ion, such as a quaternary alkylammonium salt, is more preferred. Among the organic salts, examples of the organic salt that can be particularly suitably used from the viewpoint of stability, purity, and cost include tetramethylammonium chloride, tetramethylammonium bromide, or tetramethylammonium iodide; tetraethylammonium chloride, tetraethylammonium bromide, or tetraethylammonium iodide; or tetrapropylammonium chloride, tetrapropylammonium bromide, or tetrapropylammonium iodide.

For the acid, salt, or the like containing an anion species used to generate an anion species in the treatment liquid, an industrially available salt can be used, or it can be prepared by a known method. For example, a quaternary alkylammonium salt containing the anionic species can be prepared by preparing a tetramethylammonium hydroxide aqueous solution, and blowing chlorine, bromine, or the like. In addition, a solution containing a quaternary alkylammonium salt of the anionic species can also be prepared by a method in which a tetramethylammonium hydroxide solution is brought into contact with a cation-exchange type ion exchange resin to change cations in the ion exchange resin to tetramethylammonium ions, and then a halic acid, such as chloric acid, bromic acid, or iodic acid, is contacted to exchange ions.

A concentration of ozone in the treatment liquid according to an embodiment of the present invention is not particularly limited as long as it does not depart from the spirit of the present invention but is preferably 0.1 mass ppm or more and 1000 mass ppm (0.1 mass %) or less. With the concentration of ozone of less than 0.1 mass ppm, the rate of oxidizing $Br^-$ to hypobromite ions would be low, and this does not affect the etching rate of the group 6 metal. In addition, from the viewpoint of stable dissolution of ozone in the treatment liquid, the concentration of ozone is more preferably 1 mass ppm or more and 500 mass ppm or less. Furthermore, with the concentration of ozone of 5 mass ppm or more and 200 mass ppm or less, the treatment liquid can efficiently oxidize $Br^-$ to hypobromite ions, and thus this is particularly preferred. Moreover, for the method of generating ozone and the method of dissolving ozone in the treatment liquid, a widely known method can be used without any problem; for example, a treatment liquid containing ozone can be prepared by generating ozone by an electrical discharge in a gas containing oxygen and bringing the gas containing ozone into contact with the treatment liquid to partially or entirely dissolve ozone in the treatment liquid. Ozone can be continuously or intermittently brought into contact with the treatment liquid. Ozone is brought into contact with the treatment liquid before start of the etching of the group 6 metal, and thus a treatment liquid that will exhibit a small decrease in $BrO^-$ concentration and a stable etching rate can be prepared.

The method of producing hypochlorite ions is not particularly limited, and hypochlorite ions produced by any method can be suitably used in the treatment liquid according to an embodiment of the present invention. For the method of generating hypochlorite ions, for example, addition of a hypochlorite salt or blowing chlorine gas can be suitably used. Among these, in a method of adding a hypochlorite salt to the treatment liquid, the concentration of hypochlorite ions can be easily controlled, and handling of the hypochlorite salt is easy; thus, the method is further suitable. Such a hypochlorite salt is exemplified by a tetraalkylammonium hypochlorite, sodium hypochlorite, potassium hypochlorite, calcium hypochlorite, magnesium hypochlorite, and hypochlorous acid. Among these, a tetraalkylammonium hypochlorite or hypochlorous acid is particularly suitable from the viewpoint that they do not contain metal, which is otherwise problematic in semiconductor manufacturing, and a tetraalkylammonium hypochlorite is most suitable because it can be stably present even at high concentrations.

The tetraalkylammonium hypochlorite is suitably a tetraalkylammonium hypochlorite containing a tetraalkylammonium ion having from 1 to 20 carbons per alkyl group is suitable. Specifically, such a tetraalkylammonium hypochlorite is tetramethylammonium hypochlorite, tetraethylammonium hypochlorite, tetrapropylammonium hypochlorite, tetrabutylammonium hypochlorite, tetrapentylammonium hypochlorite, or tetrahexylammonium hypochlorite, and more suitably tetramethylammonium hypochlorite or tetraethylammonium hypochlorite from the viewpoint that they have a large number of hypochlorite ions per unit weight. Tetramethylammonium hypochlorite is most suitable because high-purity products are readily available.

The method for producing tetramethylammonium hypochlorite described above is not particularly limited, and those produced by a widely known method can be used. For example, tetramethylammonium hypochlorite produced by a method below can be suitably used: a method of blowing chlorine into tetramethylammonium hydroxide, a method of mixing hypochlorous acid and tetramethylammonium hydroxide, a method of replacing cations in a hypochlorite salt solution by tetramethylammonium using an ion exchange resin, a method of mixing a distillate of a solution containing a hypochlorite salt with tetramethylammonium hydroxide, or the like.

A method of producing hypobromite ions in the treatment liquid includes a method of oxidizing a bromine-containing compound with an oxidizing agent. An amount ratio of the bromine-containing compound and the oxidizing agent contained in the treatment liquid is preferably determined in view of: a stoichiometric ratio and reaction rate when the bromine-containing compound and the oxidizing agent react and produce hypobromite ions; and a stoichiometric ratio and reaction rate when $Br^-$ and the oxidizing agent contained in the treatment liquid react and produce hypobromite ions. In reality, however, a plurality of factors intricately affects each other in these reactions, and thus determining the appropriate amount ratio of the bromine-containing compound and the oxidizing agent is difficult. However, when a ratio of a value obtained by dividing a concentration of the bromine-containing compound by a chemical equivalent (molar equivalent) of the bromine-containing compound to a value obtained by dividing a concentration of the oxidizing agent by a chemical equivalent (molar equivalent) of the oxidizing agent is in the range of 0.001 to 100, the oxidizing agent can not only efficiently produce $BrO^-$ from the bromine-containing compound but also oxidize $Br^-$ produced by reduction reaction or decomposition reaction of $BrO^-$ to $BrO^-$ again, thus stabilizing the etching rate of the group 6 metal.

For example, when the bromine-containing compound is tetramethylammonium bromide and the oxidizing agent is tetramethylammonium hypochlorite, the reaction equivalent (molar equivalent) of the bromine-containing compound and the chemical equivalent (molar equivalent) of the oxidizing agent in the reaction between these chemical species are equal, and thus the ratio of the molar concentration of the bromine-containing compound to the concentration of the oxidizing agent is to be in the range of 0.001 to 100.

An amount ratio of hypobromite ions and hypochlorite ions contained in the treatment liquid is preferably determined in view of the decreasing rate of hypobromite ions, more precisely, in view of a production rate of $Br^-$ by reduction reaction and/or decomposition reaction of hypobromite ions and a rate of oxidation reaction from $Br^-$ to $BrO^-$ by hypochlorite ions. In reality, however, a plurality of factors intricately affects each other in these reactions, and thus determining an appropriate amount ratio of hypobromite ions and hypochlorite ions is difficult. However, when the ratio of the molar concentration of hypobromite ions to the molar concentration of hypochlorite ions (molar concentration of hypobromite ions/molar concentration of hypochlorite ions) is in the range of 0.001 to 100, $Br^-$ produced by reduction reaction or decomposition reaction of $BrO^-$ can be oxidized to $BrO^-$ again by hypochlorite ions, thus stabilizing the etching rate of the group 6 metal.

The pH of the treatment liquid for a semiconductor of the group 6 metal in an embodiment of the present invention is preferably 8 or higher and 14 or lower and most preferably 8 or higher and 13 or lower. The treatment liquid with a pH of 8 or higher and 14 or lower can efficiently etch the group 6 metal.

The group 6 metal contained in a semiconductor wafer to which the treatment liquid according to an embodiment of the present invention is applied can be formed by any method. In the film formation of the group 6 metal, a widely known method in a semiconductor manufacturing process can be used, for example, such as CVD, ALD, sputtering, or plating. The group 6 metal contained in the semiconductor wafer to which the treatment liquid according to an embodiment of the present invention is applied can be one of tungsten, molybdenum, or chromium or can be a plurality of these.

In an embodiment of the present invention, tungsten is not only metal tungsten, a tungsten-based metal containing tungsten as a main component, and an alloy of tungsten with another metal, but also a compound substantially containing tungsten. An example of the tungsten-based metal includes an oxide ($W_xO_y$), nitride (WN), and oxynitride (WNO) of tungsten, and cobalt tungsten phosphorus (CoWP). Here, the oxide of tungsten is tungsten dioxide ($WO_2$), tungsten trioxide ($WO_3$), or ditungsten pentoxide ($W_2O_5$).

In an embodiment of the present invention, molybdenum is not only metal molybdenum, a molybdenum-based metal containing molybdenum as a main component, and an alloy of molybdenum with another metal but also a compound substantially containing molybdenum. An example of the molybdenum-based metal includes an oxide ($Mo_xO_y$), nitride (MoN), and oxynitride (MoNO) of molybdenum. Here, the oxide of molybdenum is molybdenum dioxide ($MoO_2$), molybdenum trioxide ($MoO_3$), or dimolybdenum pentoxide ($Mo_2O_5$).

In an embodiment of the present invention, chromium is not only metal chromium, a chromium-based metal containing chromium as a main component, and an alloy of chromium with another metal but also a compound substantially containing chromium. An example of the chromium-based metal includes an oxide ($Cr_xO_y$), nitride (CrN), and oxynitride (CrNO) of chromium. Here, the oxide of chromium is chromium dioxide ($CrO_2$), chromium trioxide ($CrO_3$), or dichromium pentoxide ($Cr_2O_5$).

The alloy of the group 6 metal with another metal can contain any metal other than the group 6 metal. An example of the metal other than the group 6 metal contained in the alloy of the group 6 metal with another metal includes tantalum, silicon, copper, hafnium, zirconium, aluminum, vanadium, cobalt, nickel, manganese, gold, rhodium, palladium, titanium, ruthenium, platinum, and iridium, and the alloy can contain an oxide, a nitride, or a silicide of a metal of these.

The group 6 metal of these can be an intermetallic compound, an ionic compound, or a complex. In addition, the group 6 metal can be exposed at the surface of the wafer or can be covered with another metal, a metal oxide film, an insulating film, a resist, or the like.

Another aspect of the treatment liquid of the present invention is a treatment liquid containing at least a bromine-containing compound, an oxidizing agent, a base compound, and water. The aspect will be described for each component below.

(Bromine-Containing Compound)

The bromine-containing compound used in the treatment liquid according to an embodiment of the present invention can be any compound that contains a bromine atom and is oxidized by an oxidizing agent described later to produce bromine, hypobromous acid, a hypobromite ion, bromous acid, a bromite ion, bromic acid, a bromate ion, perbromic acid, a perbromate ion, or a bromide ion. As an example, at least one selected from the group consisting of bromine salts and hydrogen bromide is preferably used. Hydrogen bromide referred to here can be hydrogen bromide gas or hydrobromic acid, which is an aqueous solution of hydrogen bromide. Examples of the bromine salt can include lithium bromide, sodium bromide, potassium bromide, rubidium bromide, cesium bromide, ammonium bromide, and onium bromides. The onium bromide referred to here is a compound formed of an onium ion and a bromide ion. An onium ion is a compound of a polyatomic cation formed by addition of excess protons (hydrogen cations) to a monatomic anion. Specifically, the onium ion is a cation, such as an imidazolium ion, a pyrrolidinium ion, a pyridinium ion, a piperidinium ion, an ammonium ion, a phosphonium ion, a fluoronium ion, a chloronium ion, a bromonium ion, an iodonium ion, an oxonium ion, a sulfonium ion, a selenonium ion, a telluronium ion, an arsonium ion, a stibonium ion, and a bismuthonium ion. In addition, a compound that produces hypobromous acid or a hypobromite ion in the treatment liquid can also be suitably used as the bromine-containing compound. Examples of such compounds include, but are not limited to, bromohydantoins, bromoisocyanuric acids, bromsulfamic acids, and bromchloramines. The compound is more specifically exemplified by 1-bromo-3-chloro-5,5-dimethylhydantoin, 1,3-dibromo-5,5-dimethylhydantoin, and tribromoisocyanuric acid.

The bromine-containing compound can be added as hydrogen bromide or a bromine salt to the treatment liquid, can be added as a solution containing a bromine salt to the treatment liquid, or can be added as bromine gas to the treatment liquid. Because of ease of handling in a semiconductor manufacturing process, the bromine-containing compound is preferably mixed as a bromine salt, or a solution containing a bromine salt or hydrogen bromide with another treatment liquid. One type of bromine-containing compound can be contained in the treatment liquid, or two or more types can be used in combination.

In semiconductor manufacturing, the bromine-containing compound desirably does not contain metal or a metal ion because otherwise contamination with metal or a metal ion causes a decrease in the yield. Among bromine gas, hydrogen bromide, and a bromine salt, an onium bromide can be suitably used as the bromine-containing compound according to an embodiment of the present invention because it does not substantially contain metal. Among onium bromides, a quaternary onium bromide, a tertiary onium bromide, and hydrogen bromide are industrially readily available and easy to handle, and thus are more suitable as the bromine-containing compound according to an embodiment of the present invention.

A quaternary onium bromide is a bromine salt composed of an ammonium ion or a phosphonium ion that can be stably present in the treatment liquid. Examples of the quaternary onium bromide include tetramethylammonium bromide, tetraethylammonium bromide, tetrapropylammonium bromide, tetrabutylammonium bromide, tetrapentylammonium bromide, tetrahexylammonium bromide, methyltriethylammonium bromide, diethyldimethylammonium bromide, trimethylpropylammonium bromide, butyltrimethylammonium bromide, trimethylnonylammonium bromide, decyltrimethylammonium bromide, tetradecyltrimethylammonium bromide, hexadecyltrimethylammonium bromide, trimethylstearylammonium bromide, decamethonium bromide, phenyltrimethylammonium bromide, benzyltrimethylammonium bromide, dimethylpyrrolidinium bromide, dimethylpiperidinium bromide, 1-butyl-3-methylimidazolium bromide, and 1-butyl-3-methylpyridinium bromide. In addition, a compound in which a proton is added to a tertiary amine, a secondary amine, or a primary amine can also be used. Examples include methylamine hydrobromide, dimethylamine hydrobromide, ethylamine hydrobromide, diethylamine hydrobromide, triethylamine hydrobromide, 2-bromoethylamine hydrobromide, 2-bromoethyldiethylamine hydrobromide, ethylenediamine dihydrobromide, propylamine hydrobromide, butylamine hydrobromide, tert-butylamine hydrobromide, neopentylamine hydrobromide, 3-bromo-1-propylamine hydrobromide, dodecylamine hydrobromide, cyclohexaneamine hydrobromide, and benzylamine hydrobromide. Examples of the quaternary phosphonium bromide include tetramethylphosphonium bromide, tetraethylphosphonium bromide, tetrapropylphosphonium bromide, tetrabutylphosphonium bromide, tetraphenylphosphonium bromide, methyltriphenylphosphonium bromide, phenyltrimethylphosphonium bromide, and methoxycarbonylmethyl(triphenyl)phosphonium bromide. A tertiary onium bromide is a bromine salt composed of a sulfonium ion that can be stably present in the treatment liquid. Examples of the tertiary sulfonium bromide include trimethylsulfonium bromide, triethylsulfonium bromide, tripropylsulfonium bromide, tributylsulfonium bromide, triphenylsulfonium bromide, and (2 carboxyethyl)dimethylsulfonium bromide. Among these, the onium bromide is preferably a quaternary onium bromide, which is a bromine salt composed of an ammonium ion, because it is highly stable, a high-purity product is industrially readily available and is inexpensive.

The quaternary onium bromide is preferably a tetraalkylammonium bromide that is particularly excellent in stability and can be easily synthesized.

In the tetraalkylammonium bromide, the number of carbons of the alkyl group is not particularly limited, and the numbers of carbons of the four alkyl groups can be identical or different. For such an alkylammonium bromide, a tetraalkylammonium bromide having from 1 to 20 carbons per alkyl group can be suitably used. Among these, a tetraalkylammonium bromide having a small number of carbons in the alkyl group can be more suitably used because of a large number of bromine atoms per weight. Examples include tetramethylammonium bromide, tetraethylammonium bromide, tetrapropylammonium bromide, tetrabutylammonium bromide, tetrapentylammonium bromide, and tetrahexylammonium bromide. Among these, tetramethylammonium bromide, tetraethylammonium bromide, tetrapropylammonium bromide, or tetrabutylammonium bromide is suitable, and tetramethylammonium bromide is most suitable. One or plurality of the bromine-containing compounds can be contained in the treatment liquid.

For the tetraalkylammonium bromide used in an embodiment of the present invention, a commercially available tetraalkylammonium bromide can be used, or a tetraalkylammonium bromide produced from a tetraalkylammonium and a bromide ion can be used. For the method for producing the tetraalkylammonium bromide, the method may need only mixing: an aqueous solution containing a tetraalkylammonium hydroxide; and an aqueous solution containing bromide ions, or a gas containing bromine and generating bromide ions when dissolved in water.

Examples of the tetraalkylammonium hydroxide used to produce the tetraalkylammonium bromide include tetramethylammonium hydroxide, tetraethylammonium hydroxide, tetrapropylammonium hydroxide, and tetrabutylammonium hydroxide. Among these, tetramethylammonium hydroxide is more preferred in because it provides a large number of hydroxide ions per unit weight and high-purity products are readily available.

Examples of the bromide ion source to generate bromide ions used to produce the tetraalkylammonium bromide include hydrogen bromide, lithium bromide, sodium bromide, potassium bromide, rubidium bromide, cesium bromide, and ammonium bromide. Among these, hydrogen bromide is preferred because it contains substantially no metal and is industrially readily available, and high-purity products are readily available.

An added amount of the bromine-containing compound is not particularly limited and is to be determined in view of the etching rate of the group 6 metal, the stability of the treatment liquid, the solubility and the cost of the bromine-containing compound, and the like. The bromine-containing compound added to the treatment liquid is oxidized by a oxidizing agent described later to a chemical species effective for etching the group 6 metal, specifically bromine ($Br_2$), hypobromous acid (HBrO), a hypobromite ion ($BrO^-$), bromous acid ($HBrO_2$), a bromite ion ($BrO_2^-$), bromic acid ($HBrO_3$), a bromate ion ($BrO_3^-$), perbromic acid ($HBrO_4$), a perbromate ion ($BrO_4^-$), or a bromide ion ($Br^-$).

Among the chemical species effective for etching the group 6 metal, the treatment liquid containing HBrO, $BrO^-$, $HBrO_2$, $BrO_2^-$, $HBrO_3$, and/or $BrO_3^-$ has a high etching rate of the group 6 metal, and thus the treatment liquid preferably contains a chemical species of these. Among these, the treatment liquid containing a large amount of HBrO and $BrO^-$ (which may be referred to as "$BrO^-$ and the like") has particularly a high etching rate of the group 6 metal and thus is more preferred in that the treatment time can be shortened.

Thus, when the bromine-containing compound is oxidized by the oxidizing agent, bromine atoms contained in the bromine-containing compound are preferably oxidized to HBrO, $BrO^-$, $HBrO_2$, $BrO_2^-$, $HBrO_3$, and/or $BrO_3^-$, and among others, more preferably oxidized to $BrO^-$ and the like.

For the bromine-containing compound, the added amount of the bromine-containing compound is preferably 0.008 mass % or more and less than 10 mass % in terms of bromine element relative to a total mass of the treatment liquid. With the added amount less than 0.008 mass %, the etching rate of the group 6 metal would be low, reducing practicality. With the added amount less than 10 mass %, the etching rate of the group 6 metal is easily controlled, allowing easy control of the manufacturing process. Furthermore, decomposition of chemical species effective for etching the group 6 metal is unlikely to occur, achieving good stability of the etching rate. Thus, the added amount of the bromine-containing compound is preferably 0.008 mass % or more and less than 10 mass % in terms of bromine element relative to a total mass of the treatment liquid, more preferably 0.04 mass % or more and less than 8 mass %, even more preferably 0.08 mass % or more and less than 4 mass %, particularly preferably 0.08 mass % or more and less than 2 mass %, and most preferably 0.08 mass % or more and less than 1.5 mass %.

When chloride ions in the treatment liquid according to an embodiment of the present invention is large, the etching rate of the group 6 metal tends to decrease. On the other hand, as described above, when the treatment liquid contains chloride ions, roughening of the metal surface due to etching is suppressed. Thus, to achieve both the etching rate and suppression of roughening of the surface due to etching, concentrations of hypobromite ions and chloride ions contained in the treatment liquid are preferably adjusted in the ranges described below. That is, the concentration ranges of hypobromite ions and hypochlorite ions contained in the treatment liquid are as follows: preferably, the hypobromite ion concentration is 0.008 mass % or more and less than 10 mass % in terms of bromine element relative to a total mass of the treatment liquid, and the ratio of hypobromite ions to chloride ions contained in the treatment liquid is 0.001 or more and 10 or less; more preferably, the hypobromite ion concentration is 0.04 mass % or more and less than 8 mass % in terms of bromine element relative to a total mass of the treatment liquid, and the ratio of hypobromite ions to chloride ions contained in the treatment liquid is 0.05 or more and 1 or less; and particularly preferably, the hypobromite ion concentration is 0.08 mass % or more and less than 2 mass % in terms of bromine element relative to a total mass of the treatment liquid, and the ratio of hypobromite ions to chloride ions contained in the treatment liquid is 0.1 or more and 1 or less.

The pH of the solution containing the bromine-containing compound is not particularly limited, but the pH is desirably 8 or higher and 14 or lower and more preferably 8 or higher and 13 or lower. The solution in this pH range can reduce the pH change that may occur when a solution containing an oxidizing agent described later and the solution containing the bromine-containing compound are mixed, and enables stable production, storage, and use of the treatment liquid according to an embodiment of the present invention.

An iodine-containing compound can also be used in the same manner as the bromine-containing compound. In this case, iodine contained in the iodine-containing compound is oxidized by the oxidizing agent contained in the treatment liquid and can be transformed into the chemical species for etching the group 6 metal.

(Oxidizing Agent)

The oxidizing agent used in the treatment liquid according to an embodiment of the present invention has a function of oxidizing the bromine-containing compound and capable of producing the chemical species effective for etching the group 6 metal. Specifically, examples include nitric acid, sulfuric acid, persulfuric acid, peroxodisulfuric acid, hypochlorous acid, chlorous acid, chloric acid, perchloric acid, hypobromous acid, bromous acid, bromic acid, perbromic acid, hypoiodous acid, iodous acid, iodic acid, periodic acid, their salts, and ions produced by dissociation of these salts; and furthermore, hydrogen peroxide, ozone, fluorine, chlorine, bromine, iodine, permanganate salts, chromates, dichromates, and cerium salts. The oxidizing agent of these can be used alone, or a plurality of them can be used in combination. When the oxidizing agent is added to the treatment liquid according to an embodiment of the present invention, the form of the oxidizing agent, solid, liquid, or gas, can be selected according to the properties of the oxidizing agent to be used.

Among the above oxidizing agent, in terms of stable presence even under alkaline conditions, the oxidizing agent is preferably hypochlorous acid, chlorous acid, chloric acid, perchloric acid, hypobromous acid, bromous acid, bromic acid, perbromic acid, hypoiodous acid, iodous acid, iodic acid, periodic acid, and a salt of these, and an ion produced by dissociation of a salt of these, ozone, or hydrogen peroxide; more preferably hypochlorous acid, chlorous acid, chloric acid, perchloric acid, hypobromous acid, bromous acid, bromic acid, perbromic acid, and a salt of these, and an ion produced by dissociation of a salt of these, ozone, or hydrogen peroxide; and even more preferably hypochlorite ions or ozone; and most preferably hypochlorite ions.

Using hypochlorous acid, its salt a tetraalkylammonium hypochlorite, periodic acid, or ozone as the oxidizing agent can substantially prevent contamination with metal and thus is suitable for the treatment liquid for semiconductor manufacturing. The periodic acid is suitably orthoperiodic acid or metaperiodic acid. Among these, a tetraalkylammonium hypochlorite is stably present in alkali and can efficiently oxidize the bromine-containing compound, and thus is particularly suitable.

The concentration of the oxidizing agent is not particularly limited, and the oxidizing agent can be added in an amount that allows oxidation of the bromine-containing compound to the chemical species effective for etching the group 6 metal.

The added amount of the oxidizing agent is preferably 0.1 mass ppm or more and 20 mass % or less. With the added amount less than 0.1 mass ppm, the oxidizing agent could not efficiently oxidize the bromine-containing compound, reducing the etching rate of the group 6 metal. That is, a composition in which the oxidizing agent is not mixed has a low etching rate. On the other hand, with the added amount of the oxidizing agent more than 20 mass %, the stability of the oxidizing agent decreases, and thus this is not appropriate. From the viewpoint of the etching rate of the group 6 metal, the concentration of the oxidizing agent is more preferably 1 mass ppm or more and 10 mass % or less and most preferably 0.5 mass % or more and 5 mass % or less.

The pH of the solution containing the oxidizing agent is not particularly limited, but the pH is desirably 8 or higher and 14 or lower and more preferably 8 or higher and 13 or lower. The solution in this pH range can reduce the pH change that may occur when the solution containing the bromine-containing compound and the solution containing the oxidizing agent are mixed, and enables stable production, storage, and use of the treatment liquid according to an embodiment of the present invention.

(Base Compound)

The base compound used in the treatment liquid according to an embodiment of the present invention is not particularly limited, but lithium hydroxide, sodium hydroxide, potassium hydroxide, rubidium hydroxide, cesium hydroxide, magnesium hydroxide, calcium hydroxide, strontium hydroxide, barium hydroxide, ammonia, choline, an alkylammonium hydroxide, or the like is used. Among these base compounds, sodium hydroxide, potassium hydroxide, ammonia, choline, and an alkylammonium hydroxide are readily available, provide a high etching rate of the group 6 metal when used in the treatment liquid, and thus are suitable. Ammonia, choline, and an alkylammonium hydroxide contain no metal and thus can be particularly suitably used as the treatment liquid according to an embodiment of the present invention. For the alkylammonium hydroxide, tetramethylammonium hydroxide, tetraethylammonium hydroxide, tetrapropylammonium hydroxide, tetrabutylammonium hydroxide, or the like is industrially available; and tetramethylammonium hydroxide is most suitable in that a high-purity grade for semiconductor manufacturing is readily available. The base compound can be added to the treatment liquid as a solid or an aqueous solution.

When the base compound is a solid, it can be added as a solution containing the base compound to the treatment liquid. A concentration of the base compound is not particularly limited as long as it does not depart from the object of the present invention, but the pH of the solution containing the base compound is desirably in the range of a pH of 8 or higher and 14 or lower and more preferably 8 or higher and 13 or lower. The pH of the solution containing the base compound in this pH range can reduce the pH change that may occur when the solution containing the oxidizing agent and the solution containing the bromine-containing compound are mixed, and enables stable production, storage, and use of the treatment liquid according to an embodiment of the present invention.

(Water)

Water contained in the treatment liquid according to an embodiment of the present invention is preferably water from which metal ions, organic impurities, particulate particles, or the like are removed by distillation, ion exchange treatment, filtration treatment, adsorption treatment of various types, and the like. Pure water or ultrapure water is particularly preferred. Such water can be obtained by a known method widely used in semiconductor manufacturing.

(pH)

The pH of the treatment liquid according to an embodiment of the present invention is preferably 8 or higher and 14 or lower. The treatment liquid in this pH range can etch the group 6 metal at a sufficient rate. In the treatment liquid with a pH lower than 8, decomposition of hypobromite ions would occur, and etching would not proceed. On the other hand, in the treatment liquid with a pH higher than 14, decomposition of the oxidizing agent would occur, and thus the oxidation of the bromine-containing compound would not be constant. This means that the etching rate of the group 6 metal would not be constant, complicating the process control in the semiconductor manufacturing process, and thus this needs to be avoided. In addition, if desired, a pH-buffering agent can also be added to the treatment liquid to reduce the pH change of the treatment liquid. For the pH-buffering agent, a widely known pH-buffering agent can be used, and examples can include one or more type(s) selected from phosphoric acid, boric acid, carbonic acid, oxalic acid, and salts of these. The salt is preferably an organic salt.

The pH when the group 6 metal is etched is preferably 8 or higher and 14 or lower and more preferably 8 or higher and 13 or lower. The treatment liquid in this pH range can provide a sufficient etching rate in etching the group 6 metal.

(Method for Producing Treatment Liquid)

When the treatment liquid according to an embodiment of the present invention contains the bromine-containing compound, the oxidizing agent, the base compound, and water, the treatment liquid can be a one-part solution or a two- or more-part solution. When the treatment liquid is a one-part solution, the solution contains all of the bromine-containing compound, the oxidizing agent, the base compound, and water. When the treatment liquid is a two- or more-part solution, the treatment liquid is to be produced by mixing each solution. In addition, when the treatment liquid is a two- or more-part solution, each solution contains at least one or more of the bromine-containing compound, the oxidizing agent, the base compound, and water. Each solution can contain an additional component described later. Regardless of whether the treatment liquid is a one-part solution or a two- or more-part solution, the bromine-containing compound, the oxidizing agent, and the basic compound are simultaneously present in the treatment liquid, thus the bromine-containing compound is oxidized by the oxidizing agent, and a chemical species etching the group 6 metal is produced.

When the treatment liquid according to an embodiment of the present invention is produced by mixing two or more solutions, it is preferable that a solution containing the bromine-containing compound and a solution containing the oxidizing agent are prepared separately. Separating the bromine-containing compound from the oxidizing agent prevents oxidation of the bromine-containing compound due to the oxidizing agent and can stably store the treatment liquid according to an embodiment of the present invention.

An aspect of a method for producing the treatment liquid according to an embodiment of the present invention can include a production method including mixing a solution with hypobromous acid, a hypobromite salt, bromine water, or bromine gas, where the solution contains the base compound. Mixing the solution containing the base compound with hypobromous acid, a hypobromite salt, bromine water, or bromine gas produces hypobromite ions in the mixed solution, forming the treatment liquid according to an embodiment of the present invention. In the production method of the present aspect, the concentration of hypobromite ions contained in the treatment liquid can be appropriately adjusted by the concentration of hypobromous acid, a hypobromite salt, or bromine water, or the supply amount of the bromine gas. Furthermore, the production of hypobromite ions in the production method of the present aspect is extremely fast, and the treatment liquid can be used in a semiconductor manufacturing process immediately after mixing.

In addition, another aspect of the method for producing the treatment liquid according to an embodiment of the present invention can include a production method including mixing a solution with the bromine-containing compound where the solution contains a hypochlorous acid compound and the base compound. Mixing the solution containing a hypochlorous acid compound and the base compound with the bromine-containing compound causes oxidation of the bromine-containing compound by the hypochlorous acid compound and generation of hypobromite ions. And thus, the treatment liquid according to an embodiment of the present invention is formed. In the production method of the present aspect, the bromine-containing compound can be appropriately selected from chemical species with various structures as described above. This makes it possible to appropriately adjust the concentration of hypobromite ions contained in the treatment liquid and their stability. Furthermore, this also makes it possible to select a raw material in view of the production cost, as well as safety, hazardousness, and handling properties of the raw material, and the like. The treatment liquid according to an embodiment of the present invention produced by any aspect can be suitably used in a semiconductor manufacturing process.

For the method of mixing the solutions, a method widely known as a method of mixing semiconductor chemical solutions can be used. For example, a method using a mixing tank, a method of mixing in a piping of a semiconductor manufacturing apparatus (in-line mixing), or a method of mixing by pouring a plurality of solutions onto a wafer can be suitably used.

When a plurality of solutions is mixed to produce the treatment liquid according to an embodiment of the present invention, the solutions can be mixed at any time. When the oxidation of the bromine-containing compound requires time, the solutions are mixed before etching the group 6 metal, and this provides time to generate a chemical species effective for etching the group 6 metal. In this case, if the oxidation of the bromine-containing compound takes time, this would become a bottleneck in the manufacturing line and thus may lead to a decrease in throughput. For such a reason, the time required for oxidation is preferably short and preferably one hour or shorter. The time required for oxidation of the bromine-containing compound can be controlled by appropriately selecting the oxidizing agent concentration, the bromine-containing compound concentration, the pH of the treatment liquid, the temperature of the treatment liquid, the method of stirring the treatment liquid, and the like. For example, when hypobromite ions are produced by oxidation of the bromine-containing compound using the oxidizing agent, the time required for oxidation can be shorten by increasing the concentrations of the reactants from the viewpoint of reaction kinetics. In this case, the concentrations of both the oxidizing agent and the bromine-containing compound can be increased, or the concentration of either one can be increased. In addition, increasing the temperature of the treatment liquid during mixing can also reduce the time required for oxidation of the bromine-containing compound.

Furthermore, when the concentration of the chemical species for etching the group 6 metal is low, it is surmised that this may shorten the lifetime of the treatment liquid and make it difficult to control the manufacturing process. In such a case, the solutions are preferably mixed immediately before etching the group 6 metal.

Thus, when a plurality of solutions is mixed, preferably a solution containing the oxidizing agent and the base compound is mixed with the bromine-containing compound, and more preferably a solution containing hypochlorite ions and the base compound is mixed with the bromine-containing compound. The solution containing hypochlorite ions and the base compound is preferably alkaline. In addition, the mixing is preferably performed by adding the bromine-containing compound to the solution containing the oxidizing agent and the base compound. This is because, for example, when the oxidizing agent is an alkali solution containing hypochlorous acid and the solution containing the bromine-containing compound is an acid solution, and the alkali solution is gradually added to the acid solution, hypochlorous acid may decompose in the acid solution, and this may generate toxic chlorine gas. Both the solution containing the oxidizing agent and the base compound and the solution containing the bromine-containing compound can be solutions or non-aqueous solutions, but when the solvent is other than water, such as an organic or inorganic solvent, the solvent may be decomposed by reaction of the solvent with the oxidizing agent. For such a reason, the solutions are preferably aqueous solutions.

In mixing the treatment liquid according to an embodiment of the present invention, the pH of the treatment liquid after mixing is preferably alkaline. Specifically, the pH of the treatment liquid is preferably 8 or higher and 14 or lower. When the pH of the treatment liquid before mixing is lower than 8, the concentration of the base compound and/or water is adjusted to make the pH of the treatment liquid (containing the bromine-containing compound, the oxidizing agent, the base compound, and water) after mixing 8 or higher and 14 or lower. The pH of the treatment liquid after mixing is thus maintained to 8 or higher and 14 or lower, and this allows the bromine-containing compound to be rapidly converted by the oxidizing agent to a chemical species effective for etching the group 6 metal and enables etching of a tungsten film at a stable and sufficient rate.

When a plurality of solutions is mixed to produce a chemical species effective for etching the group 6 metal, the pH of the solutions to be mixed can be identical or different. When the pH of the solutions is identical, the pH of the treatment liquid according to an embodiment of the present invention does not significantly change after mixing and can be suitably used as an etchant for the group 6 metal.

When a plurality of solutions is mixed to produce the chemical species effective for etching the group 6 metal, the composition of the treatment liquid according to an embodiment of the present invention (the bromine-containing compound concentration, the oxidizing agent concentration, the basic compound concentration, and pH) after mixing needs only to be within the range described above, and the mixing method, such as the mixing ratio of the solutions to be mixed and the order of mixing, is not particularly limited. However, for example, when the alkali solution containing a hypochlorous acid compound and the acid solution containing the bromine-containing compound are mixed, decomposition of the hypochlorous acid compound may proceed locally, and thus, in this case, preferably the acid solution containing the bromine-containing compound is mixed to the alkali solution containing the hypochlorous acid compound.

In an embodiment of the present invention, the hypochlorous acid compound refers to a compound that produces hypochlorous acid or a hypochlorite ion in the treatment liquid. An example of the hypochlorous acid compound can include hypochlorous acid, a hypochlorite salt, a hydantoin, an isocyanuric acid, a sulfamic acid, and a chloramine. Among these, the hypochlorous acid compound is preferably hypochlorous acid or a hypochlorite salt because they can efficiently produce hypochlorous acid or a hypochlorite ion. The hypochlorite salt is preferably a tetraalkylammonium hypochlorite and more preferably tetramethylammonium hypochlorite because it provides a large amount of hypochlorous acid or hypochlorite ions per unit weight among them.

The chemical species effective for etching the group 6 metal, the chemical species produced by oxidation of the bromine-containing compound by the oxidizing agent, varies depending on the pH or oxidation-reduction potential (ORP) of the treatment liquid or the like, but is mainly bromine or bromide ions, hypobromous acid, bromous acid, bromic acid, perbromic acid, and ions of these.

In addition, a content of metal, specifically, sodium, potassium, aluminum, magnesium, iron, nickel, copper, silver, cadmium, and lead each in the treatment liquid according to an embodiment of the present invention is preferably 1 ppb or less.

Amounts of ammonia and an amine contained in the treatment liquid according to an embodiment of the present invention, the bromine-containing compound, the oxidizing agent, the base compound, water, the solvent, and an additional additive used in the treatment liquid are preferably small. This is because if ammonia and an amine are present in the treatment liquid, they would react with the oxidizing agent, the bromine-containing compound, a chemical species effective for etching the group 6 metal, the chemical species produced from the bromine-containing compound, and the like, and this would reduce the stability of the treatment liquid. For example, when tetramethylammonium hydroxide is used as the base compound, ammonia and an amine contained in the base compound, trimethylamine in particular, may cause a decrease in stability of the treatment liquid. Thus, when tetramethylammonium hydroxide is used in the treatment liquid according to an embodiment of the present invention, a total of amines contained in the base compound is preferably 100 ppm or less. With the total of amines of 100 ppm or less, the effect of the reaction with the oxidizing agent, the bromine-containing compound, or a chemical species effective for etching the group 6 metal, the chemical species produced from the bromine-containing compound, is slight and not impair the stability of the treatment liquid.

The treatment liquid according to an embodiment of the present invention is preferably produced under a light-shielded condition to prevent decomposition of the oxidizing agent, a chemical species effective for etching the group 6 metal, the chemical species produced from the bromine-containing compound and the like, due to light.

In addition, in the production of the treatment liquid according to an embodiment of the present invention, dissolution of carbon dioxide in the treatment liquid is preferably prevented. When the treatment liquid according to an embodiment of the present invention is alkaline, carbon dioxide readily dissolves in the treatment liquid and may cause a pH change. A pH change of the treatment liquid, if any, would not only be a main cause for changing the etching rate of the group 6 metal but also reduce the stability of the treatment liquid. The dissolution of carbon dioxide to the treatment liquid can be reduced by a method, such as flowing an inert gas to purge carbon dioxide in a production apparatus or performing the reaction under an inert gas atmosphere. With an amount of carbon dioxide in a production apparatus of 100 ppm or less, the effect of dissolution of carbon dioxide is negligible.

In the production of the treatment liquid according to an embodiment of the present invention, a surface of a reaction vessel, the surface to be in contact with the treatment liquid, is preferably formed of glass or an organic polymer material. This is because the reaction vessel with an inner surface formed of glass or an organic polymer material can further reduce contamination with impurities, such as metal, a metal oxide, or an organic material. Examples of the organic polymer material that can be used for the inner surface of the reaction vessel include vinyl chloride resins (soft or hard vinyl chloride resins), nylon resins, silicone resins, polyolefin resins (polyethylene and polypropylene), and fluororesins. Among these, in view of ease of molding, solvent resistance, low impurity dissolution, and the like, a fluororesin is preferred. The fluororesin is not particularly limited as long as it is a resin (polymer) containing a fluorine atom, and a known fluororesin can be used. Examples include poly(tetrafluoroethylene), poly(chlorotrifluoroethylene), poly(vinylidene fluoride), tetrafluoroethylene-hexafluoropropylene copolymers, tetrafluoroethylene-perfluoroalkyl vinyl ether copolymers, tetrafluoroethylene-ethylene copolymers, chlorotrifluoroethylene-ethylene copolymers, and cyclic polymers of perfluoro(butenyl vinyl ether).

(Additional Additive)

To the treatment liquid according to an embodiment of the present invention, an additional additive that has been used in semiconductor treatment liquids in the art can be blended as desired, in a range that does not impair the object of the present invention. Examples of the additional additive that can be added include an acid, a metal anticorrosive, a water-soluble organic solvent, a fluorine compound, an oxidizing agent, a reducing agent, a complexing agent, a chelating agent, a surfactant, an antifoaming agent, a pH adjusting agent, and a stabilizing agent. The additive can be added alone, or a plurality of the additives can be added in combination.

The treatment liquid according to an embodiment of the present invention may contain an alkali metal ion, an alkaline earth metal ion, or the like, which is derived from the additive or contained for the convenience of production of the treatment liquid, or the like. For example, sodium ions, potassium ions, calcium ions, or the like may be contained. However, the alkali metal ion, the alkaline earth metal ion, or the like if remains on a semiconductor wafer would cause an adverse effect to the semiconductor device (an adverse effect, such as a decrease in the yield of the semiconductor wafer). Thus, the amount is preferably small, and practically, these are preferably not contained infinitely. Thus, for example, the pH adjusting agent is preferably an organic alkali, such as ammonia, an amine, choline, or a tetraalkylammonium hydroxide, rather than an alkali metal hydroxide, such as sodium hydroxide, or an alkaline earth metal hydroxide.

Specifically, a total amount of an alkali metal ion and an alkaline earth metal ion is preferably 1 mass % or less, more preferably 0.7 mass % or less, even more preferably 0.3 mass % or less, particularly preferably 10 ppm or less, and most preferably 500 ppb or less.

The treatment liquid according to an embodiment of the present invention can further contain an organic solvent. For the organic solvent, any organic solvent that does not impair the function of the treatment liquid according to an embodiment of the present invention can be used. An example includes sulfolane, acetonitrile, carbon tetrachloride, and 1,4-dioxane, but as a matter of course, the organic solvent is not limited to these.

A temperature when the group 6 metal is etched by the treatment liquid according to an embodiment of the present invention is not particularly limited and is to be determined in view of the etching rate of the group 6 metal, the stability of the treatment liquid, and the like. The etching rate of the group 6 metal increases at higher temperatures. The temperature for etching the group 6 metal is preferably from 10° C. to 90° C., more preferably from 15° C. to 70° C., and most preferably from 20° C. to 60° C.

A treatment time when the group 6 metal is etched by the treatment liquid according to an embodiment of the present invention is in the range of 0.1 to 120 minutes and preferably of 0.3 to 60 minutes, and is to be appropriately selected according to etching conditions or a semiconductor device to be used. An organic solvent, such as an alcohol, can be used as a rinse solution after using the treatment liquid according to an embodiment of the present invention, but simply rinsing with deionized water is sufficient.

The treatment liquid according to an embodiment of the present invention can be suitably used in treating a substrate including a film containing the group 6 metal. The substrate can be exemplified by a substrate on which a film containing the group 6 metal is formed, for example, a silicon wafer, a glass, a plastic, and a semiconductor substrate other than silicon. Using the treatment liquid according to an embodiment of the present invention enables etching of the film containing the group 6 metal at a sufficient rate, the film present on a substrate of these. This etches (dissolves) the group 6 metal present on the substrate, processes and/or removes the metal, and thus can form a semiconductor device, form a wiring, control the film thickness of the metal, form an electrode, and the like.

Using the treatment liquid can remove the group 6 metal deposited on the end surface or the back surface of a semiconductor wafer at a sufficient etching rate. The sufficient etching rate refers to an etching rate of 50 nm/min or more when the group 6 metal is tungsten, an etching rate of 50 nm/min or more when the group 6 metal is molybdenum, and an etching rate of 50 nm/min or more when the group 6 metal is chromium. When the etching at a greater rate than the above etching rate is required in the etching of the group 6 metal, the concentration(s) of hypobromite ions, hypochlorite ions, the bromine-containing compound, and/or the oxidizing agent contained in the treatment liquid, the pH of the treatment liquid, the treatment temperature, the method of bringing the treatment liquid into contact with a wafer, and the like are to be appropriately selected.

After the treatment liquid according to an embodiment of the present invention is produced, a metal film of the group 6 metal and/or an alloy film of the group 6 metal and another metal deposited on a substrate can be etched by the treatment liquid.

In addition, the treatment liquid can also be used in washing the group 6 metal deposited on a chamber inner wall, a piping, and the like in each of these apparatuses used in a semiconductor manufacturing process. For example, the treatment liquid can be used as a washing solution used in removing the group 6 metal deposited on a chamber, a piping, and the like in maintenance of an apparatus for forming the group 6 metal using physical vapor deposition (PVD) or chemical vapor deposition (CVD).

(Storage of Treatment Liquid)

The treatment liquid according to an embodiment of the present invention is preferably stored at a low temperature and/or under a light-shielded condition. Storage at a low temperature and/or under a light-shielded condition is expected to provide an effect of preventing decomposition of the oxidizing agent and hypobromite ions in the treatment liquid. Furthermore, the stability of the treatment liquid can be maintained by storing the treatment liquid in a container whose surface that is to be in contact with the solution is formed of an organic polymer material, or by storing the treatment liquid in a container filled with an inert gas to prevent carbon dioxide contamination. In addition, the inner surface of the container, that is, the surface to be in contact with the treatment liquid, is preferably formed of glass or an organic polymer material. This is because the container with an inner surface formed of glass or an organic polymer material can further reduce contamination with impurities, such as metal, a metal oxide, or an organic material. For the organic polymer material used for the inner surface of the reaction vessel, a material exemplified in the production of the treatment liquid according to an embodiment of the present invention can be suitably used. In addition, the pH when the treatment liquid is stored can be appropriately selected, but the pH of the treatment liquid is preferably alkaline and even more preferably 8 or higher and 14 or lower to prevent decomposition of hypobromite ions, the bromine-containing compound, the oxidizing agent, the additional additive, or the like.

EXAMPLES

The present invention will be described more specifically below by examples, but the present invention is not limited to these examples.

(pH Measurement Method)

For each examples and comparative examples, 10 mL of the treatment liquid prepared was measured for pH using a tabletop pH meter (LAQUA F-73, manufactured by Horiba, Ltd.). The pH was measured after the treatment liquid was prepared and stabilized at 25° C.

(Film Formation of Group 6 Metal and Amount of Change in Film Thickness)

An oxide film was formed on a silicon wafer using a batch thermal oxidation furnace, and a film of a group 6 metal was formed on the oxide film using a sputtering method. When the group 6 metal was tungsten, a film of tungsten was formed with a thickness of 8000 Å (±100%). When the group 6 metal was molybdenum or chromium, a film of molybdenum or chromium was formed with a thickness of 1000 Å (±10%). To determine the film thickness of the group 6 metal, each sheet resistance was measured with a four-probe resistance measuring device (Loresta-GP, manufactured by Mitsubishi Chemical Analytech Co., Ltd.) and converted to a film thickness, and this was the film thickness of the group 6 metal before etching treatment. The sheet resistance was measured likewise with a four-probe resistance measuring device also after etching treatment, the sheet resistance was converted to a film thickness, and this was the film thickness of the group 6 metal after etching treatment. The difference between the film thickness of the group 6 metal after etching treatment and the film thickness of the group 6 metal before etching treatment was the amount of change in the film thickness before and after etching treatment.

(Method for Calculating Etching Rate of Group 6 Metal)

For each examples and comparative examples, 60 mL of the treatment liquid was prepared in a fluororesin container with a lid (94.0-mL PFA container, manufactured by As One Corporation). Each sample piece of 10×20 mm was immersed in the treatment liquid at 25° C. for a predetermined time, and the group 6 metal was etched.

In addition, 60 mL of the treatment liquid was prepared in a fluororesin container with a lid and this was immersed for 1 hour in a water bath (water bath with an Isotemp general-purpose hood, manufactured by ThermoFisher Scientific) warmed to 60° C., and the treatment liquid temperature was increased to 60° C. Each sample piece of 10×20 mm was immersed in the treatment liquid at 60° C. for one minute, and the group 6 metal was etched.

The amount of change in the film thickness before and after the etching treatment was calculated as the etching rate and evaluated as the etching rate in an embodiment of the present invention.

(Method for Calculating Hypobromite Ion and Hypochlorite Ion Concentrations)

The hypobromite ion and hypochlorite ion concentrations were measured using an ultraviolet-visible spectrophotometer (UV-2600, manufactured by Shimadzu Corporation). A calibration curve was produced using an aqueous solution of hypobromite ions and hypochlorite ions with known concentrations, and the hypobromite ion and hypochlorite ion concentrations in the produced treatment liquid were determined. The hypobromite ion concentration was determined from measurement data when the absorption spectrum was stabilized after mixing a bromine-containing compound, an oxidizing agent, and a base compound.

(Damage Evaluation of Silicon-Based Material)

An oxide film ($SiO_2$ film) was formed on a silicon wafer using a batch thermal oxidation furnace. For each examples and comparative examples, 60 mL of the treatment liquids was prepared in a fluororesin container with a lid (94.0-mL PFA container, manufactured by As One Corporation), and each sample piece of 10×20 mm was immersed in the treatment liquid at 25° C., and the $SiO_2$ film was etched. The dissolution amount of the $SiO_2$ film was determined from the difference in film thickness before and after the treatment determined by spectroscopic ellipsometry, and the value obtained by dividing by the treatment time was taken as the $SiO_2$ etching rate.

(Surface Evaluation after Etching)

The time to etch the group 6 metal film 50 nm was calculated from the etching rate calculated by the above method for calculating the etching rate, and a film in which the group 6 metal film was etched 50 nm±20 nm based on the calculated time was prepared. The metal surface before and after etching was observed with a field emission scanning electron microscope (JSM-7800F Prime, available from JEOL Ltd.), the presence or absence of roughening of the surface was observed and evaluated by the following criteria. Roughening of the surface is smaller in the order of A to D, and evaluations A to C are all acceptable and an evaluation D is unacceptable.

A: No roughening of the surface was observed
B: Roughening of the surface was slightly observed
C: Roughening of the surface was observed for the entire surface, but the roughness was shallow
D: Roughening of the surface was observed for the entire surface, and the roughness was deep Example 1

Production of Oxidizing Agent

In a 2-L glass three-neck flask (manufactured by Cosmos Bead Co., Ltd.), 527 g of a 25 mass % tetramethylammonium hydroxide aqueous solution and 473 g of ultrapure water were mixed, and a 13.2 mass % tetramethylammonium hydroxide aqueous solution with a $CO_2$ content of 0.5 ppm was obtained. The pH at this time was 14.2.

A rotor (manufactured by As One, 30 mm in total length×8 mm in diameter) was then placed in the three-necked flask, and a thermometer protecting tube (manufactured by Cosmos Bead Co., Ltd., bottom-sealed type) and a thermometer were placed in one opening. A PFA tube (F-8011-02, manufactured by Flon Industry) connected to a chlorine gas cylinder and a nitrogen gas cylinder was inserted, such that switch between chlorine gas and nitrogen gas could be made optionally, and the tip of the tube was immersed in the bottom of the solution. The remaining one opening was connected to a gas-washing bottle (gas-washing bottle, model No. 2450/500, manufactured by As One Corporation) filled with a 5 mass % sodium hydroxide aqueous solution. Nitrogen gas with a carbon dioxide concentration less than 1 ppm was then introduced through the PFA tube at 200 cc m (25° C.) for 20 minutes, to purge carbon dioxide in the gas phase. At this time, the carbon dioxide concentration in the gas phase was 1 ppm or less.

A magnetic stirrer (C-MAG HS10, manufactured by As One Corporation) was placed under the three-neck flask and rotated at 300 rpm to stir. While the periphery of the three-neck flask was cooled with ice water, chlorine gas (manufactured by Fujiox Co., Ltd., specification purity 99.4%) was supplied at 200 ccm (25° C.) for 69 minutes, and a mixed solution of a tetramethylammonium hypochlorite aqueous solution (oxidizing agent; 6.78 mass % equivalent, 0.54 mol/L) and tetramethylammonium hydroxide (0.91 mass % equivalent, 0.1 mol/L) was obtained. At this time, the solution temperature during the reaction was 11° C.

(Production of Treatment Liquid)

To 92.06 g of the mixed solution of the tetramethylammonium hypochlorite aqueous solution and tetramethylammonium hydroxide obtained by the above operation, 7.94 g (7.7 mass % equivalent, 0.5 mol/L, 4.0 mass % in terms of bromine element) of 97 mass % tetramethylammonium bromide (manufactured by Tokyo Chemical Industry Co., Ltd.) was added, and 100 g of a treatment liquid with a composition described in Table 1 was obtained. Here, water described in Table 1 was water containing tetramethylammonium chloride when the oxidizing agent was tetramethylammonium hypochlorite.

(Evaluations)

The pH of the treatment liquid immediately after production, the etching rate of the group 6 metal, and the hypobromite ion concentration were evaluated. The evaluation of the etching rate of the group 6 metal was performed by "method for calculating etching rate of group 6 metal" described above. In addition, the evaluation of the damage to the $SiO_2$ film was performed by "damage evaluation of silicon-based material" described above.

Example 2

In Example 2, to the mixed solution of the tetramethylammonium hypochlorite aqueous solution and tetramethylammonium hydroxide obtained by the above operation, a 15 wt. % HCl and ultrapure water were added, and a 0.45 mol/L tetramethylammonium hypochlorite aqueous solution with a pH of 12.0 was prepared. To 93.47 g of the resulting mixed solution of tetramethylammonium hypochlorite and tetramethylammonium hydroxide, 6.53 g of 97 mass % tetramethylammonium bromide was added, and 100 g of a treatment liquid described in Table 1 was obtained. Evaluations were performed using a tungsten film (sample piece) prepared in the same manner as in Example 1.

Examples 3 to 10

In Examples 3 to 10, treatment liquids were prepared in the same manner as in Example 2 to have the compositions shown in Table 1, and evaluations were performed using a tungsten film (sample piece) prepared in the same manner as in Example 1.

Example 11

In a 2-L glass three-neck flask (manufactured by Cosmos Bead Co., Ltd.) 990 g of a 25 mass % tetramethylammonium hydroxide aqueous solution and 10 g of ultrapure water were mixed, and a 24.74 mass % tetramethylammonium hydroxide aqueous solution with a $CO_2$ content of 0.5 ppm was obtained. The pH at this time was 14.4.

Carbon dioxide in the gas phase was purged by the same operation as in Example 1. At this time, the carbon dioxide concentration in the gas phase was 1 ppm or less.

A magnetic stirrer (C-MAG HS10, manufactured by As One Corporation) was placed in the bottom portion of the three-neck flask and rotated at 300 rpm to stir. While the periphery of the three-neck flask was cooled with ice water, chlorine gas (manufactured by Fujiox Co., Ltd., specification purity 99.4%) was supplied at 200 ccm (25° C.) for 146 minutes, and a mixed solution of a tetramethylammonium hypochlorite aqueous solution (oxidizing agent; 13.94 mass % equivalent, 1.11 mol/L) and tetramethylammonium hydroxide (2.88 mass % equivalent, 0.32 mol/L) was obtained. At this time, the solution temperature during the reaction was 11° C.

To 92.06 g of the mixed solution of the tetramethylammonium hypochlorite aqueous solution and tetramethylammonium hydroxide obtained by the above operation, 15.88 g (15.41 mass % equivalent, 1.0 mol/L, 7.99 mass % in terms of bromine element) of 97 mass % tetramethylammonium bromide (manufactured by Tokyo Chemical Industry Co., Ltd.) was added, and 100 g of a treatment liquid with a composition described in Table 1 was obtained. Evaluations were performed using a tungsten film (sample piece) prepared in the same manner as in Example 1.

Example 12

In Example 12, to a mixed solution of a tetramethylammonium hypochlorite aqueous solution and tetramethylammonium hydroxide prepared in the same manner as in Example 2 to have the composition of Table 1, orthoperiodic acid (manufactured by FUJIFILM Wako Pure Chemical Corporation, content >98.5%) was added to have the composition of Table 1, and a mixed solution of hypobromite ions and orthoperiodic acid was prepared. Evaluations were performed using a tungsten film (sample piece) prepared in the same manner as in Example 1.

Example 13

Example 13 was prepared by adding tetramethylammonium hydroxide, ultrapure water, and tetramethylammonium bromide to sodium hypochlorite pentahydrate (SHC5, manufactured by Nippon Light Metal Company, Ltd.) to have the composition of Table 1. Evaluations were performed using a tungsten film (sample piece) prepared in the same manner as in Example 1.

Examples 14 and 15

Examples 14 and 15 were prepared by adding tetramethylammonium bromide and tetramethylammonium chloride (manufactured by Tokyo Chemical Industry Co., Ltd., purity >98%) to a mixed solution of a tetramethylammonium hypochlorite aqueous solution and tetramethylammonium hydroxide prepared in the same manner as in Example 2 to have the compositions of Table 1. Evaluations were performed using a tungsten film (sample piece) prepared in the same manner as in Example 1.

Examples 16 to 22

In Examples 16 to 22, treatment liquids were prepared in the same manner as in Example 2 to have the compositions shown in Table 3, and evaluations were performed using a prepared molybdenum film or chromium film (sample piece).

Example 23

In Example 23, a treatment liquid was prepared in the same manner as in Example 13 to have the composition shown in Table 3, and evaluations were performed using a prepared molybdenum film or chromium film (sample piece).

Examples 24 and 25

In Examples 24 and 25, treatment liquids were prepared in the same manner as in Example 14 to have the compositions shown in Table 3, and evaluations were performed using a prepared molybdenum film or chromium film (sample piece).

Comparative Examples 1 to 7

In Comparative Examples 1 to 7, mixed solutions of a tetramethylammonium hypochlorite aqueous solution and tetramethylammonium hydroxide were prepared in the same manner as in Example 2 to have the compositions shown in Table 1, and evaluations were performed using a tungsten film (sample piece) prepared in the same manner as in Example 1.

Comparative Example 8

Comparative Example 8 was prepared by adding ultrapure water to orthoperiodic acid to have the composition shown in Table 1. Evaluations were performed using a tungsten film (sample piece) prepared in the same manner as in Example 1.

Comparative Example 9

In Comparative Example 9, 20 mass % of hydrofluoric acid (manufactured by Kanto Chemical Co., Inc., ultra-high purity grade, concentration 50%), 7 mass % of nitric acid solution (manufactured by Kanto Chemical Co., ltd., ultra-high purity grade, concentration of 69%), and water were mixed and stirred, and a treatment liquid was prepared. Evaluations were performed using a tungsten film (sample piece) prepared in the same manner as in Example 1.

Comparative Examples 10 to 15

In Comparative Examples 10 to 15, mixed solutions of a tetramethylammonium hypochlorite aqueous solution and tetramethylammonium hydroxide were prepared in the same manner as in Example 2 to have the compositions shown in Table 3, and evaluations were performed using a prepared molybdenum film or chromium film (sample piece).

The compositions of the treatment liquids and each evaluation result are shown in Tables 2 and 4. As shown in Table 2, the treatment liquids of the present embodiment had a high etching rate of the group 6 metal, confirming the excellence. In addition, in all the examples, the film thickness of the $SiO_2$ film was not reduced by the etching treatment, confirming that $SiO_2$ was not damaged.

TABLE 1

| | Bromine-containing compound (mass %/mol/L) | Oxidizing agent (mass %/mol/L) | Base compound (mass %/mol/L) | Chloride ions (mass %/mol/L) | Water (mass %) | pH | Hypobromite ions (mol/L) |
|---|---|---|---|---|---|---|---|
| Example 1 | TMABr 7.70/0.5 | TMAClO 6.28/0.5 | TMAH 0.91/0.1 | — | 85.11 | 13 | 0.5 |
| Example 2 | TMABr 6.47/0.42 | TMAClO 5.28/0.42 | TMAH 0.09/0.01 | — | 88.16 | 12 | 0.42 |
| Example 3 | TMABr 6.47/0.42 | TMAClO 5.28/0.42 | TMAH 0.009/0.001 | — | 88.24 | 11 | 0.05 |
| Example 4 | TMABr 0.77/0.05 | TMAClO 0.63/0.05 | TMAH 0.0009/0.0001 | — | 98.6 | 10 | 0.42 |
| Example 5 | TMABr 647/042 | TMAClO 5.28/0.42 | TMAH 0.000009/0.000001 | — | 88.25 | 8 | 0.42 |
| Example 6 | TMABr 1.54/0.1 | TMAClO 0.13/0.01 | TMAH 0.00009/0.00001 | — | 98.33 | 9 | 0.005 |
| Example 7 | TMABr 3.08/0.2 | TMAClO 2.51/0.2 | TMAH 0.09/0.01 | — | 95.86 | 12 | 0.2 |
| Example 8 | TMABr 0.15/0.01 | TMAClO 0.13/0.01 | TMAH 0.0009/0.0001 | — | 99.72 | 10 | 0.01 |
| Example 9 | TMABr 0.063/0.005 | TMAClO 0.077/0.005 | TMAH 0.0009/0.0001 | — | 99.86 | 10 | 0.001 |
| Example 10 | TMABr 0.15/0.01 | TMAClO 0.013/0.001 | TMAH 0.0009/0.0001 | — | 99.84 | 10 | 0.5 |
| Example 11 | TMABr 15.41/1.0 | TMAClO 12.06/0.96 | TMAH 2.88/0.32 | — | 69.16 | 13.5 | 1 |
| Example 12 | TMABr 1.54/0.1 | TMAClO 0.63/0.05 $H_5IO_6$ 1.14/0.05 | TMAH 0.0009/0.0001 | — | 96.69 | 10 | 0.05 |
| Example 13 | TMABr 1.54/0.1 | NaClO 0.37/0.05 | TMAH 0.009/0.001 | — | 98.08 | 11 | 0.05 |
| Example 14 | TMABr 0.77/0.05 | TMAClO 0.63/0.05 | TMAH 0.09/0.01 | TMACl 10.41/0.95 | 88.1 | 12 | 0.05 |
| Example 15 | TMABr 7.70/0.5 | TMAClO 6.28/0.5 | TMAH 0.91/0.1 | TMACl 15.0/1.37 | 70.93 | 13 | 0.5 |
| Comparative Example 1 | — | TMAClO 6.47/0.42 | TMAH 0.09/0.01 | — | 93.44 | 12 | — |
| Comparative Example 2 | — | TMAClO 6.47/0.42 | TMAH 0.009/0.001 | — | 93.52 | 11 | — |
| Comparative Example 3 | — | TMAClO 6.47/0.42 | TMAH 0.0009/0.0001 | — | 93.53 | 10 | — |
| Comparative Example 4 | — | TMAClO 6.47/0.42 | TMAH 0.00009/0.00001 | — | 93.53 | 9 | — |
| Comparative Example 5 | — | TMAClO 6.47/0.42 | TMAH 0.000009/0.000001 | — | 93.53 | 8 | — |
| Comparative Example 6 | — | TMAClO 6.28/0.5 | TMAH 0.91/0.1 | — | 92.81 | 13 | — |
| Comparative Example 7 | — | TMAClO 0.13/0.01 | TMAH 0.000009/0.000001 | — | 99.87 | 8 | — |
| Comparative Example 8 | — | $H_5IO_6$ 1.0/0.04 | — | — | 99.00 | 1.5 | — |
| Comparative Example 9 | — | HF 20/1.00 | — | — | 73.00 | — | — |

TABLE 1-continued

| | Bromine-containing compound (mass %/mol/L) | Oxidizing agent (mass %/mol/L) | Base compound (mass %/mol/L) | Chloride ions (mass %/mol/L) | Water (mass %) | pH | Hypobromite ions (mol/L) |
|---|---|---|---|---|---|---|---|
| | | HNO$_3$ 7/0.11 | | | | | |

TABLE 2

| | pH | Hypobromite ions (mol/L) | Hypobromite ions/ chloride ions molar ratio | Treatment temperature (° C.) | Treatment time (sec) | W etching rate (nm/min) | SiO$_2$ etching rate (nm/min) | Surface smoothness |
|---|---|---|---|---|---|---|---|---|
| Example 1 | 13 | 0.5 | 0.5 | 25 | 60 | 114 | <1 | B |
| Example 2 | 12 | 0.42 | 0.5 | 25 | 30 | 770 | <1 | B |
| Example 3 | 11 | 0.05 | 0.5 | 25 | 60 | 161 | <1 | A |
| Example 4 | 10 | 0.42 | 0.5 | 25 | 30 | 377 | <1 | B |
| Example 5 | 8 | 0.01 | 0.5 | 25 | 60 | 52 | <1 | A |
| Example 6 | 9 | 0.005 | 0.5 | 25 | 60 | 58 | <1 | B |
| Example 7 | 12 | 0.2 | 0.5 | 25 | 60 | 108 | <1 | A |
| Example 8 | 10 | 0.01 | 0.5 | 25 | 60 | 79 | <1 | A |
| Example 9 | 10 | 0.001 | 0.5 | 60 | 60 | 63 | <1 | B |
| Example 10 | 10 | 0.5 | 0.5 | 25 | 60 | 65 | <1 | B |
| Example 11 | 13.5 | 1 | 0.5 | 25 | 60 | 54 | <1 | B |
| Example 12 | 10 | 0.05 | 0.5 | 25 | 60 | 127 | <1 | A |
| Example 13 | 11 | 0.05 | 1.0 | 25 | 60 | 232 | <1 | B |
| Example 14 | 12 | 0.05 | 0.05 | 25 | 60 | 108 | <1 | A |
| Example 15 | 13 | 0.5 | 0.36 | 25 | 60 | 91 | <1 | A |
| Comparative Example 1 | 12 | — | — | 25 | 300 | 1.4 | <1 | C |
| Comparative Example 2 | 11 | — | — | 25 | 300 | 2.1 | <1 | C |
| Comparative Example 3 | 10 | — | — | 25 | 300 | 4.8 | <1 | C |
| Comparative Example 4 | 9 | — | — | 25 | 300 | 7.6 | <1 | C |
| Comparative Example 5 | 8 | — | — | 25 | 300 | 5.8 | <1 | C |
| Comparative Example 6 | 13 | — | — | 25 | 300 | 0.3 | <1 | D |
| Comparative Example 7 | 8 | — | — | 25 | 300 | 0.4 | <1 | D |
| Comparative Example 8 | 1.5 | — | — | 25 | 300 | — | <1 | — |
| Comparative Example 9 | — | — | — | 25 | 60 | 154 | 220 | D |

TABLE 3

| | Bromine-containing compound (mass %/mol/L) | Oxidizing agent (mass %/mol/L) | Base compound (mass %/mol/L) | Chloride fans (mass %/mol/L) | Water (mass %) | pH | Hypobromite ions (mol/L) |
|---|---|---|---|---|---|---|---|
| Example 16 | TMABr 1.54/0.1 | TMAClO 0.63/0.05 | TMAH 0.09/0.01 | — | 97.74 | 12 | 0.05 |
| Example 17 | TMABr 1.54/0.1 | TMAClO 0.63/0.05 | TMAH 0.009/0.001 | — | 97.82 | 11 | 0.05 |
| Example 18 | TMABr 1.54/0.1 | TMAClO 0.63/0.05 | TMAH 0.0009/0.0001 | — | 97.83 | 10 | 0.05 |
| Example 19 | TMABr 1.54/0.1 | TMAClO 0.13/0.01 | TMAH 0.000009/0.000001 | — | 98.33 | 8 | 0.01 |
| Example 20 | TMABr 1.54/0.1 | TMAClO 0.13/0.01 | TMAH 0.00009/0.00001 | — | 98.33 | 9 | 0.01 |
| Example 21 | TMABr 7.7/0.5 | TMAClO 6.28/0.5 | TMAH 0.91/0.1 | — | 85.11 | 13 | 0.5 |
| Example 22 | TMABr 3.08/0.2 | TMAClO 2.51/0.2 | TMAH 0.09/0.01 | — | 94.32 | 12 | 0.2 |
| Example 23 | TMABr 1.54/0.1 | NaClO 0.37/0.05 | TMAH 0.009/0.001 | — | 98.08 | 11 | 0.05 |
| Example 24 | TMABr 0.77/0.05 | TMAClO 0.63/0.05 | TMAH 0.09/0.01 | TMACl 10.41/0.95 | 88.1 | 12 | 0.05 |
| Example 25 | TMABr 7.7/0.5 | TMAClO 6.28/0.5 | TMAH 0.91/0.1 | TMACl 15.0/1.37 | 70.93 | 13 | 0.5 |
| Comparative Example 10 | — | TMAClO 0.63/0.05 | TMAH 0.09/0.01 | — | 99.28 | 12 | — |
| Comparative Example 11 | — | TMAClO 0.63/0.05 | TMAH 0.009/0.001 | — | 99.36 | 11 | — |
| Comparative Example 12 | — | TMAClO 0.63/0.05 | TMAH 0.0009/0.0001 | — | 99.37 | 10 | — |

TABLE 3-continued

|  | Bromine-containing compound (mass %/mol/L) | Oxidizing agent (mass %/mol/L) | Base compound (mass %/mol/L) | Chloride fans (mass %/mol/L) | Water (mass %) | pH | Hypobromite ions (mol/L) |
|---|---|---|---|---|---|---|---|
| Comparative Example 13 | — | TMAClO 0.13/0.01 | TMAH 0.00009/0.00001 | — | 99.87 | 9 | — |
| Comparative Example 14 | — | TMAClO 0.13/0.01 | TMAH 0.000009/0.000001 | — | 99.87 | 8 | — |
| Comparative Example 15 | — | TMAClO 6.28/0.5 | TMAH 0.91/0.1 | — | 92.81 | 13 | — |

TABLE 4

|  | pH | Hypobromite ions (mol/L) | Hypobromite ions/ chloride ions molar ratio | Treatment temperature (° C.) | Treatment time (sec) | Mo etching rate (nm/min) | Mo surface smoothness | Cr etching rate (nm/min) | Cr surface smoothness |
|---|---|---|---|---|---|---|---|---|---|
| Example 16 | 12 | 0.05 | 0.5 | 25 | 60 | 56 | A | 51 | A |
| Example 17 | 11 | 0.05 | 0.5 | 25 | 60 | 387 | A | 194 | A |
| Example 18 | 10 | 0.05 | 0.5 | 25 | 60 | 725 | A | 580 | A |
| Example 19 | 8 | 0.01 | 0.5 | 25 | 60 | 272 | A | 218 | A |
| Example 20 | 9 | 0.01 | 0.5 | 25 | 60 | 510 | A | 408 | A |
| Example 21 | 13 | 0.5 | 0.5 | 25 | 60 | 349 | B | 279 | B |
| Example 22 | 12 | 0.2 | 0.5 | 25 | 60 | 220 | A | 115 | A |
| Example 23 | 11 | 0.05 | 1.0 | 25 | 60 | 384 | B | 191 | B |
| Example 24 | 12 | 0.05 | 0.05 | 25 | 60 | 388 | A | 192 | A |
| Example 25 | 13 | 0.5 | 0.36 | 25 | 60 | 262 | A | 218 | A |
| Comparative Example 10 | 12 | — | — | 25 | 300 | 2.0 | C | 1.6 | C |
| Comparative Example 11 | 11 | — | — | 25 | 300 | 2.3 | C | 1.8 | C |
| Comparative Example 12 | 10 | — | — | 25 | 300 | 3.1 | C | 2.5 | C |
| Comparative Example 13 | 9 | — | — | 25 | 300 | 1.2 | D | 1.0 | D |
| Comparative Example 14 | 8 | — | — | 25 | 300 | 6.8 | C | 2.1 | C |
| Comparative Example 15 | 13 | — | — | 25 | 300 | 1.3 | D | 1.0 | D |

The invention claimed is:

1. A treatment liquid for a semiconductor of a group 6 metal, the treatment liquid comprising hypobromite ions and chloride ions, and a ratio of the hypobromite ions to the chloride ions is 0.05 or more and 0.5 or less.

2. The treatment liquid for a semiconductor according to claim 1, wherein the group 6 metal is at least one type of metal selected from the group consisting of tungsten, molybdenum, and chromium.

3. The treatment liquid for a semiconductor according to claim 1, wherein the hypobromite ions are 0.001 mol/L or more and 1.2 mol/L or less.

4. The treatment liquid for a semiconductor according to claim 1, wherein pH of the treatment liquid for a semiconductor is 8 or higher and 14 or lower at 25° C.

5. The treatment liquid for a semiconductor according to claim 1, further comprising a tetraalkylammonium ion.

6. The treatment liquid for a semiconductor according to claim 1, wherein the treatment liquid for a semiconductor further comprises an oxidizing agent, and an oxidation-reduction potential of the oxidizing agent exceeds an oxidation-reduction potential of a hypobromite ion/Br⁻ system.

7. The treatment liquid for a semiconductor according to claim 6, wherein the oxidizing agent contained in the treatment liquid for a semiconductor is hypochlorite ions, periodic acid, or ozone.

8. A method for producing the treatment liquid for a semiconductor according to claim 1, the method comprising mixing a solution containing a base compound with hypobromous acid, a hypobromite salt, bromine water, or bromine gas.

9. A method for producing the treatment liquid for a semiconductor according to claim 1, the method comprising mixing a solution containing a hypochlorous acid compound and a base compound with a bromine-containing compound.

10. A treatment liquid for a semiconductor containing a group 6 metal, the treatment liquid containing at least a bromine-containing compound, an oxidizing agent, a base compound, and water, wherein,
relative to a total mass, an added amount of the bromine-containing compound is 0.008 mass % or more and less than 10 mass % in terms of bromine element, and an added amount of the oxidizing agent is 0.1 mass ppm or more and 20 mass % or less;
pH at 25° C. is 8 or higher and 14 or lower; and
the treatment liquid for a semiconductor further comprises hypobromite ions and chloride ions, and a ratio of the hypobromite ions to the chloride ions is 0.05 or more and 0.5 or less.

11. The treatment liquid for a semiconductor according to claim 10, wherein the oxidizing agent is a hypochlorous acid compound or ozone.

12. The treatment liquid for a semiconductor according to claim 10, wherein the bromine-containing compound is a bromine salt or hydrogen bromide.

13. The treatment liquid for a semiconductor according to claim 12, wherein the bromine salt is a tetraalkylammonium bromide.

14. The treatment liquid for a semiconductor according to claim 10, wherein the base compound is tetramethylammonium hydroxide.

15. The treatment liquid for a semiconductor according to claim 10, wherein pH of the treatment liquid at 25° C. is 8 or higher and 13 or lower.

16. A method for producing the treatment liquid for a semiconductor according to claim 10, the method comprising mixing a solution containing the oxidizing agent and the base compound with the bromine-containing compound.

17. A method for treating a substrate, the method comprising: preparing a treatment liquid for a semiconductor by the production method according to claim 16; and then etching a film containing a group 6 metal deposited on a substrate by the treatment liquid for a semiconductor.

* * * * *